(12) United States Patent
Takayanagi

(10) Patent No.: US 12,366,795 B2
(45) Date of Patent: Jul. 22, 2025

(54) LIGHT-EMITTING DEVICE AND MANUFACTURING METHOD THEREOF, PROJECTOR, AND DISPLAY

(71) Applicant: SEIKO EPSON CORPORATION, Tokyo (JP)

(72) Inventor: Kentaro Takayanagi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 486 days.

(21) Appl. No.: 17/954,980

(22) Filed: Sep. 28, 2022

(65) Prior Publication Data

US 2023/0098065 A1 Mar. 30, 2023

(30) Foreign Application Priority Data

Sep. 29, 2021 (JP) .................................. 2021-158908

(51) Int. Cl.
*G03B 21/20* (2006.01)
*H10H 20/01* (2025.01)
*H10H 20/857* (2025.01)

(52) U.S. Cl.
CPC ......... *G03B 21/2033* (2013.01); *H10H 20/01* (2025.01); *H10H 20/857* (2025.01)

(58) Field of Classification Search
CPC .. G03B 21/2033; H10H 20/01; H10H 20/857; H10H 20/84; H10H 20/819; H10H 20/80; H10H 20/813
See application file for complete search history.

(56) References Cited

U.S. PATENT DOCUMENTS

| | | | |
|---|---|---|---|
| 8,698,124 B2 * | 4/2014 | Shibata | H10H 20/8162 438/69 |
| 2009/0321738 A1 * | 12/2009 | Kim | B82Y 10/00 257/E33.001 |
| 2010/0051986 A1 * | 3/2010 | Min | H10H 20/818 977/932 |
| 2016/0049545 A1 | 2/2016 | Choi et al. | |
| 2019/0198560 A1 | 6/2019 | Kaseya | |
| 2019/0245113 A1 * | 8/2019 | Chang | H10H 20/819 |
| 2020/0044418 A1 * | 2/2020 | Nishioka | H01S 5/18344 |
| 2020/0273908 A1 * | 8/2020 | Fujita | H10H 29/142 |
| 2020/0313039 A1 | 10/2020 | Ishizawa et al. | |

(Continued)

FOREIGN PATENT DOCUMENTS

| | | |
|---|---|---|
| JP | 2010-135858 A | 6/2010 |
| JP | 2014-086727 A | 5/2014 |

(Continued)

*Primary Examiner* — Victor A Mandala
(74) *Attorney, Agent, or Firm* — Oliff PLC

(57) ABSTRACT

A light-emitting device includes a substrate, a laminated structure that is provided at the substrate and that includes a plurality of column portions, and an insulating layer covering the plurality of column portions. The plurality of column portions include a plurality of first column portions and a plurality of second column portions. The plurality of first column portions are part of the plurality of column portions and provided on an outermost side of the plurality of column portions. Each of the plurality of second column portions includes a light-emitting layer. Each of the plurality of first column portions has a height smaller than that of the nearest second column portion of the plurality of second column portions.

8 Claims, 14 Drawing Sheets

(56) References Cited

U.S. PATENT DOCUMENTS

| | | | | |
|---|---|---|---|---|
| 2020/0412100 A1* | 12/2020 | Miyata | .................... | H01S 5/185 |
| 2021/0096452 A1* | 4/2021 | Miyata | ................ | H10H 20/835 |
| 2021/0167247 A1* | 6/2021 | Okumura | ............ | H04N 9/3155 |
| 2021/0194209 A1* | 6/2021 | Miyata | ................ | H10H 20/832 |
| 2021/0408765 A1* | 12/2021 | Ishizawa | ............ | G03B 21/2033 |
| 2022/0109286 A1* | 4/2022 | Nishioka | ............... | H01S 5/3063 |
| 2022/0140568 A1* | 5/2022 | Jiroku | ....................... | H01S 5/11 |
| | | | | 362/259 |
| 2022/0199861 A1* | 6/2022 | Noda | ................ | G03B 21/2033 |
| 2022/0239064 A1* | 7/2022 | Miyata | ............... | H01S 5/04256 |
| 2022/0278504 A1* | 9/2022 | Yoshimoto | ........... | H01S 5/1042 |
| 2022/0278508 A1* | 9/2022 | Ishizawa | .................. | H01S 5/11 |
| 2022/0285580 A1* | 9/2022 | Okuno | ................ | H10H 20/813 |
| 2023/0090522 A1* | 3/2023 | Jiroku | ................. | H01S 5/04256 |
| | | | | 257/99 |
| 2024/0380174 A1* | 11/2024 | Noda | ................. | H01S 5/04256 |

FOREIGN PATENT DOCUMENTS

| | | |
|---|---|---|
| JP | 2019-029516 A | 2/2019 |
| JP | 2019-114739 A | 7/2019 |

\* cited by examiner

LIGHT-EMITTING DEVICE AND MANUFACTURING METHOD THEREOF, PROJECTOR, AND DISPLAY

The present application is based on, and claims priority from JP Application. Serial Number 2021-158908, filed Sep. 29, 2021, the disclosure of which is hereby incorporated by reference herein in its entirety.

BACKGROUND

1. Technical Field

The present disclosure relates to a light-emitting device and a manufacturing method thereof, a projector, and a display.

2. Related Art

Semiconductor lasers are expected as next-generation light sources having high luminance. In particular, semiconductor lasers to which nanocolumns are applied are expected to realize high-power light emission with a narrow radiation angle thanks to the photonic crystal effect of nanocolumns.

For example, JP-A-2010-135858 describes a semiconductor light-emitting element that includes a plurality of nanocolumns obtained by sequentially growing and stacking an n-type GaN layer, a light-emitting layer, and a p-type GaN layer on an SiC substrate. In JP-A-2010-135858, after a p-type electrode is formed at the tips of the nanocolumns, a portion of the p-type electrode and the nanocolumns are excavated until the n-type GaN layer is reached.

In a semiconductor light-emitting device as described above, for example, when forming wiring coupled to the p-type electrode, an insulating layer is formed covering the nanocolumns to prevent contact between the wiring and the nanocolumns. However, the level difference between the nanocolumns and the n-type GaN layer not provided with nanocolumns as large, and thus there is a possibility of the insulating layer not adhering to the portion where the level difference is formed.

SUMMARY in one aspect of a light-emitting device according to the present disclosure, the light-emitting device includes: a substrate, a laminated structure provided at the substrate and including a plurality of column portions, and an insulating layer covering the plurality of column portions, wherein the plurality of column portions include a plurality of first column portions and a plurality of second column portions, the plurality of first column portions are part of the plurality of column portions and provided on an outermost side of the plurality of first column portions, each of the plurality of second column portions includes a light-emitting layer, and each of the plurality of first column portions has a height smaller than that of a second column portion closest to the each of the plurality of first column portions among the plurality of second column portions.

In one aspect of a method of manufacturing a light-emitting device according to the present disclosure, the method includes: forming, at a substrate, a laminated structure including a plurality of column portions, and forming an insulating layer covering the plurality of column portions, wherein in the formation of the laminated structure, the plurality of column portions including a plurality of first column portions and a plurality of second column portions are formed, the plurality of first column portions are part of the plurality of column portions and provided on an outermost side of the plurality of column portions, the plurality of second column portions including a light-emitting layer are formed, and each of the plurality of first column portions has a height smaller than a height of a second column portion closest to the each of the plurality of first column portions among the plurality of second column portions.

One aspect of a projector according to the present disclosure includes one aspect of the light-emitting device.

One aspect of a display according to the present disclosure includes one aspect of the light-emitting device.

DESCRIPTION OF EXEMPLARY EMBODIMENTS

Hereinafter, preferred embodiments of the present disclosure will be described in detail using the appended drawings. Note that the embodiments described below are not intended to unduly limit the content of the present disclosure as set forth in the claims. Furthermore, not all of the configurations described below necessarily represent essential requirements of the present disclosure.

1. First Embodiment 1.1. Light-Emitting Device

Figure 1:
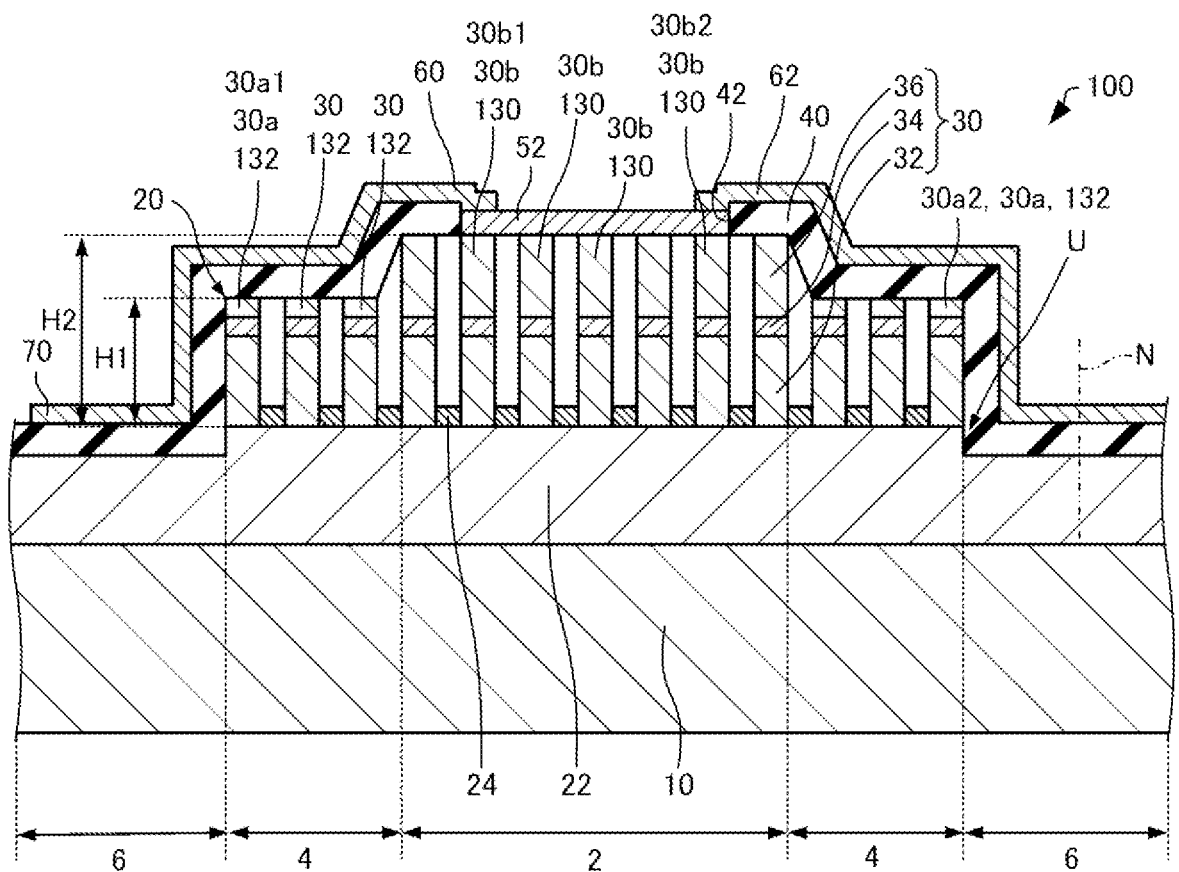
FIG. 1 is a cross-sectional view schematically illustrating a light-emitting device according to a first embodiment.
Figure 2:
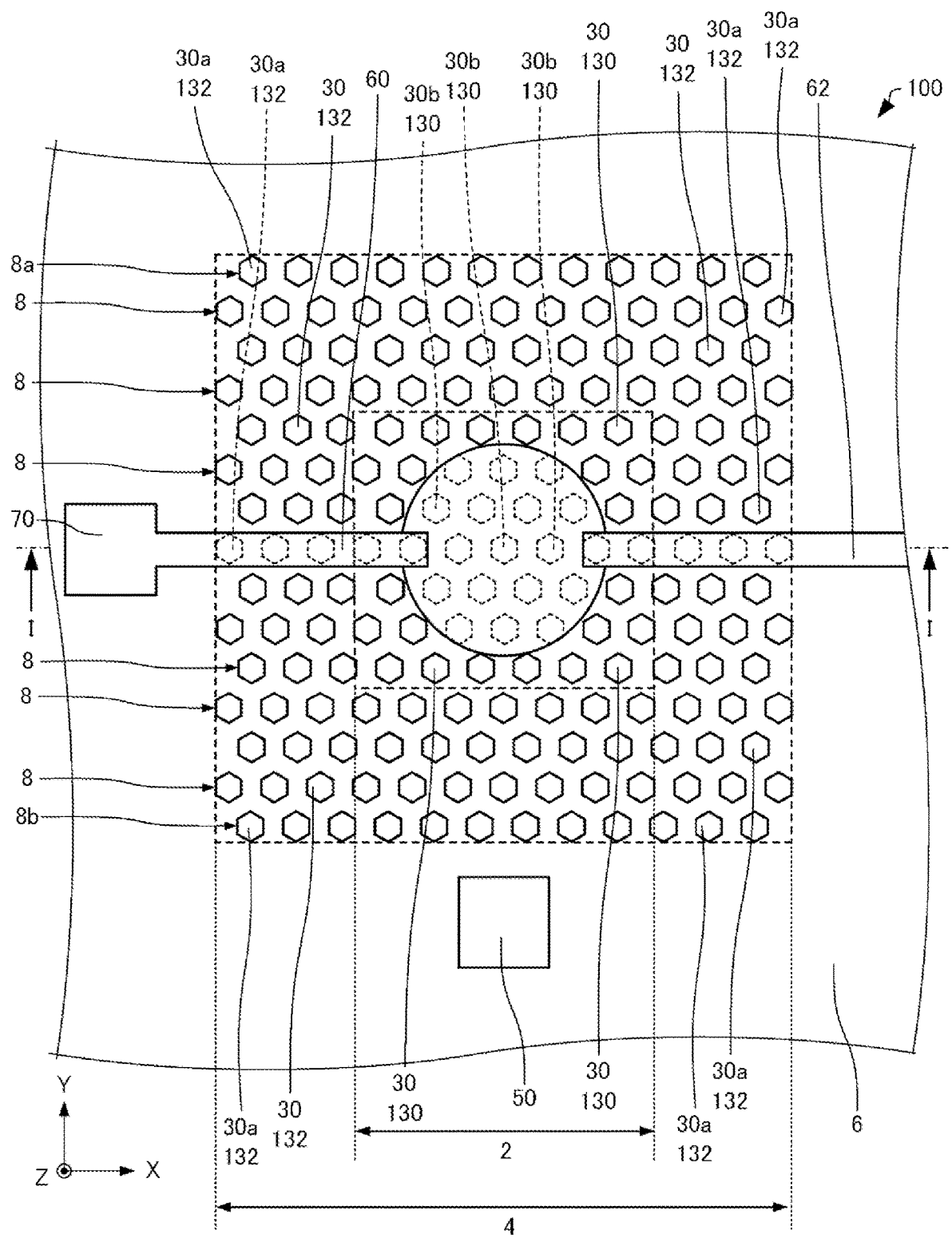
FIG. 2 is a plan view schematically illustrating the light-emitting device according to the first embodiment.

First, a light-emitting device according to a first embodiment will be described with reference to drawings. FIG. 1 is a cross-sectional view schematically illustrating a light-emitting device 100 according to the first embodiment. FIG. 2 is a plan view schematically illustrating the light-emitting device 100 according to the first embodiment. Note that FIG. 1 is a cross-sectional view taken along the line I-I in FIG. 2. Furthermore, in FIGS. 1 and 2, the X-axis, the Y-axis, and the Z-axis are illustrated as three axes orthogonal to one another.

As illustrated in FIGS. 1 and 2, the light-emitting device 100 includes, for example, a substrate 10, a laminated structure 20, an insulating layer 40, a first electrode 50, a second electrode 52, first wiring 60, second wiring 62, and a pad 70. The light-emitting device 100 is a semiconductor laser, for example.

The substrate 10 is, for example, an Si substrate, a GaN substrate, a sapphire substrate, an SiC substrate, or the like.

The laminated structure 20 is provided at the substrate 10. In the illustrated example, the laminated structure 20 is provided on the substrate 10. The laminated structure 20 includes, for example, a buffer layer 22, a mask layer 24, and a plurality of column portions 30. The column portions 30 each include, for example, a first semiconductor layer 32, a multi quantum well (MQW) layer 34, and a second semiconductor layer 36. Note that in FIG. 2, the insulating layer 40 is omit Led from illustration for convenience.

In the present specification, when the MQW layer 34 is used as reference in the stacking direction of the laminated structure 20 (hereinafter also simply referred to as the "stacking direction"), the direction going from the MQW layer 34 toward the second semiconductor layer 36 is referred to as "upward", and the direction going from the MQW layer 34 toward the first semiconductor layer 32 is referred to as "downward". Directions orthogonal to the stacking direction are also referred to as "in-plane directions". Furthermore, the "stacking direction of the laminated structure 20" refers to the stacking direction of the first semiconductor layer 32 and the MOW layer 34, and is the Z-axis direction in the illustrated example. The stacking direction is the normal N direction of the substrate 10.

The buffer layer 22 is provided on the substrate 10. The buffer layer 22 is, for example, an n-type GaN layer doped with Si.

The mask layer 24 is provided on the buffer layer 22. The mask layer 24 functions as a mask for growing the column portions 30. The mask layer 24 is, for example, a silicon oxide layer, a titanium layer, a titanium oxide layer, an aluminum oxide layer, or the like.

The column portions 30 are provided on the buffer layer 22. The column portions 30 each have a columnar shape protruding upward from the buffer layer 22. In other words, the column portions 30 protrude upward from the substrate 10 via the buffer layer 22. The column portions 30 are also referred to as, for example, nanocolumns, nanowires, nanorods, and nanopillars. The planar shape of the column portion 30 is, for example, a polygon such as a hexagon, or a circle. In the example illustrated in FIG. 2, the planar shape of the column portion 30 is a regular hexagon.

The diameter of the column portion 30 is, for example, not less than 50 nm and not greater than 500 nm. Setting the diameter of the column portion 30 to not greater than 500 nm allows a high-quality crystalline MQW layer 34 to be obtained, and the strain inherent in the MQW layer 34 to be reduced. This makes it possible to amplify light generated at the MQW layer 34 with high efficiency.

Note that when the planar shape of the column portion 30 is a circle, the "diameter of the column portion 30" is the diameter; and when the planar shape of the column portion 30 is a shape other than a circle, it is the diameter of the minimum inclusion circle. For example, when the planar shape of the column portion 30 is a polygon, the diameter of the column portion 30 is the diameter of the smallest circle including the polygon; and when the planar shape of the column portion 30 is an ellipse, it is the diameter of the smallest circle including the ellipse.

The column portions 30 are provided in plurality. The spacing between adjacent column portions 30 is, for example, not less than 1 nm and not greater than 500 nm. The plurality of column portions 30 are arranged in a predetermined pitch in a predetermined direction as viewed from the stacking direction. The plurality of column portions 30 are disposed in a triangular lattice shape or in a square lattice shape, for example. In the illustrated example, the plurality of column portions 30 are disposed in a triangular lattice shape. The plurality of column portions 30 can express the photonic crystal effect.

Note that the "pitch of column portions 30" is the distance between the centers of column portions 30 adjacent along the predetermined direction. When the planar shape of the column portion 30 is a circle, the "center of the column portion 30" is the center of such a circle; and when the planar shape of the column portion 30 is a shape other than a circle, it is the center of the minimum inclusion circle. For example, when the planar shape of the column portion 30 is a polygon, the center of the column portion 30 is the center of the smallest circle including the polygon; and when the planar shape of the column Portion 30 is an ellipse, it is the center of the smallest circle including the ellipse.

The plurality of column portions 30 include a plurality of first column portions 30a and a plurality of second column portions 30b. Of the plurality of column portions 30, first column portions 30a are provided at the outermost of the plurality of column portions 30. The plurality of first column portions 30a are column portions 30 that are provided at the outermost of the plurality of column portions 30 and that are a portion of the plurality of column portions 30. The plurality of first column portions 30a may be all or the column portions 30 that are provided at the outermost of the plurality of column portions 30. The "outermost of the plurality of column portions 30" refers to positions through which, when the centers of adjacent column portions 30 are connected with line segments to form a pattern, the line segments constituting the outer edges of the pattern pass. The "column portions 30 provided at the outermost of the plurality of column portions 30" refer to column portions 30 provided at positions through which, when the centers of adjacent column portions 30 are connected with line segments to form a pattern, the line segments constituting the outer edges of the pattern pass. In the example illustrated in FIG. 2, a plurality of column portions 30 are aligned in the X-axis direction to form a row 8, and a plurality of rows 8 are aligned in the Y-axis direction. In the illustrated example, the first column portions 30a provided at the outermost of the plurality of column portions 30 are, of the plurality of rows 8, all of the column portions 30 constituting a row 8a at the endmost in the +Y axis direction and all of the column portions 30 constituting a row 8b at the endmost in the −Y axis direction, and of each of the rows 8 other than the rows 8a and 8b of the plurality of rows 8, the column portion 30 at the end in the +X axis direction and the column portion 30 at the end in the −X axis direction. In the illustrated example, the number of the first column portions 30a is 50. In the example illustrated in FIG. 1, the column portion 30 at the endmost in the −X axis direction of the plurality of column portions 30 and the column portion 30 at the endmost in the −X axis direction of the plurality of column portions 30 are the first column portions 30a.

Each of the plurality of first column portions 30a has a height smaller than that of the nearest second column portion 30b of the plurality of second column portions 30b. In the example illustrated in FIG. 1, a first column portion 30a1 has a height smaller than that of a second column portion 30b1. Of the plurality of first column portions 30a, the first column portion 30a1 is a first column portion 30a that is provided at the end in the −X axis direction. Of the plurality of second column portions 30b, the second column portion 30b1 is a second column portion 30b that is nearest to the first column portion 30a1. In the example illustrated in FIG. 1, a first column portion 30a2 has a height smaller than that of a second column portion 30b2. Of the plurality of first column portions 30a, the first column portion 30a2 is a first column portion 30a that is provided at the end in the +X axis direction. Of the plurality of second column portions 30b, the second column portion 30b2 is a second column portion 30b that is nearest to the first column portion 30a2.

The height of the plurality of first column portions 30a is, for example, the same. The height H1 of the first column portions 30a is, for example, the smallest among the plurality of column portions 30. Note that the "height of the column portion 30" refers to the largest size in the stacking direction of the column portion 30. The height H1 of the first column portions 30a is smaller than the height H2 of the second column portions 30b. The second column portions 30b each include the MQW layer 34 as light-emitting layer. The second column portions 30b are column portions 30 that emit light upon injection of current. The plurality of second column portions 30b may have the same height, or may include a second column portion 30h having a different height among the plurality of second column portions 30b. In this case, the height of at least one of the plurality of first column portions 30a may be smaller than the height of the second column portion 30b that is the smallest among the plurality of second column portions 30b.

Low column portions 132 of the plurality of column portions 30 are column portions having a height smaller than that of high column portions 130 of the plurality of column portions 30. The high column portions 130 are provided in plurality. The low column portions 132 are provided in plurality. The plurality of low column portions 132 surround the plurality of high column portions 130 as viewed from the stacking direction. In the illustrated example, the height of the plurality of high column portions 130 is the same. The height of the plurality of low column portions 132 is the same. The diameter of the low column portions 132 is, for example, the same as the diameter of the high column portions 130. The first column portions 30a are low column portions 132. The second column portions 30b are high column portions 130.

The high column portions 130 are provided in a first region 2. In the example illustrated in FIG. 2, the shape of the first region 2 is rectangular. The low column portions 132 are provided in a second region 4. The second region 4 surrounds the first region 2 as viewed from the stacking direction. In a third region 6 surrounding the first region 2 and the second region 4 as viewed from the stacking direction, no column portion 30 is provided. The second region 4 is provided between the first region 2 and the third region 6. In the illustrated example, the first region 2, the second region 4, and the third region 6 are the upper surface of the buffer layer 22. The distance between the Third region 6 and the substrate 10 is smaller than the distance between the first region 2 and the substrate 10, and the distance between the second region 4 and the substrate 10.

As illustrated in FIG. 1, the high column portions 130 each include, for example, the first semiconductor layer 32, the MOW layer 34, and the second semiconductor layer 36.

The first semiconductor layer 32 is provided on the buffer layer 22. The first semiconductor layer 32 is provided between the substrate 10 and the MQW layer 34. The first semiconductor layer 32 is a semiconductor layer of a first conductivity type. The first semiconductor layer 32 is, for example, an n-type Gaff layer doped with Si.

The MQW layer 34 is provided on the first semiconductor layer 32. The MQW layer 34 is provided between the first semiconductor layer 32 and the second semiconductor layer 36. The MQW layer 34 is an i-type semiconductor layer not intentionally doped with impurities. The MQW layer 34 includes, for example, a well layer and a barrier layer. The well layer is, for example, an InGaN layer. The barrier layer is, for example, a GaN layer. The MQW layer 34 has a MQW structure constituted by the well layer and the barrier layer. The MQW layer 34 of the second column portions 30b is a light-emitting layer that generates light upon injection of current.

Note that the number of the well layer and the barrier layer that constitute the MQW layer 34 is not particularly limited. For example, only one well layer may be provided, in which case the high column portions 130 each include a single quantum well (SQW) layer instead of the MQW layer 34.

The second semiconductor layer 36 is provided on the MQW layer 34. The second semiconductor layer 36 provided between the MQW layer 34 and the second electrode 52. The second semiconductor layer 36 is a semiconductor layer of a second conductivity type different from the first conductivity type. The second semiconductor layer 36 is, for example, a p-type GaN layer doped with Mg. The first semiconductor layer 32 and the second semiconductor layer 36 of the second column portions 30b are clad layers having a function of confining light within the MOW layer 34.

Note that although not illustrated, an optical confinement layer (OCL) formed of an i-type InGaN layer and an i-type GaN layer may be provided at least either between the first semiconductor layer 32 and the MQW layer 34, or between the MQW layer 34 and the second semiconductor layer 36. Furthermore, the second semiconductor layer 36 may include an electron blocking layer (EBL) formed of a p-type AlGaN layer.

In the light-emitting device 100, a PIN diode is constituted by the p-type second semiconductor layer 36 of a second column portion 30b, the i-type MQW layer 34 of the second column portion 30b, and the n-type first semiconductor layer 32 of the second column portion 30b. In the light-emitting device 100, applying a forward bias voltage of the PIN diode between the first electrode 50 and the second electrode 52 causes the MQW layer 34 of the second column portion 30b to be injected with current, causing a recombination of electrons and holes at the MQW layer 34 of the second column portion 30b. This recombination generates light. The light generated at the MQW layer 34 of the second column portion 30b propagates in in-plane directions, forms a standing wave due to the photonic crystal effect of the plurality of column portions 30, and receives the gain at the MQW layer 34 of the second column portion 30b to lase. Then, the light-emitting device 100 emits +1 order diffracted light and −1 order diffracted light as laser light in the stacking direction.

Although not illustrated, a reflection layer may be provided between the substrate 10 and the buffer layer 22, or under or below the substrate 10. The reflection layer is, for example, a distributed Bragg reflector (DBR) layer. The reflection layer can reflect light generated at the MQW layer 34 of the second column portion 30b, and the light-emitting device 100 can emit light only from the second electrode 52 side.

The low column portions 132 each include, for example, the first semiconductor layer 32, the MOW layer 34, and the second semiconductor layer 36. The size of the second semiconductor layer 36 in the stacking direction of the low column portions 132 is smaller than the size of the second semiconductor layer 36 in the stacking direction of the high column portions 130, The second semiconductor layer 36 of the low column portions 132 is not electrically coupled to the second electrode 52. Accordingly, in the MQW layer 34 of the low column portions 132, recombination of electrons and holes does not occur. The low column portions 132 do not emit light. The low column portions 132 are not injected with current. Note that although not illustrated, the low column portions 132 may be constituted by only the first semiconductor layer 32 and the MQW layer 34, or may be constituted by only the first semiconductor layer 32.

The insulating layer 40 covers the laminated structure 20. The insulating layer 40 covers the plurality of column portions 30. Specifically, the insulating layer 40 covers the plurality of low column portions 132 and the buffer layer 22. The first column portions 30a are covered with the insulating layer 40. The second column portions 30b are not covered with the insulating layer 40. The insulating layer 40 is, for example, a silicon oxide layer. The insulating layer 40 is provided with a contact hole 42. The contact hole 42 overlaps high column portions 130 as viewed from the stacking direction. In the illustrated example, the contact hole 42 overlaps second column portions 30b.

The first electrode 50 is provided on the buffer layer 22. In the example illustrated in FIG. 2, the first electrode 50 is provided in the third region 6. The buffer layer 22 may be in ohmic contact with the first electrode 50. The first electrode 50 is electrically coupled to the first semiconductor layer 32 of the second column portions 30b. In the illustrated example, the first electrode 50 is electrically coupled to the first semiconductor layer 32 of the second column portions 30b via the buffer layer 22. The first electrode 50 is one electrode for injecting current into the MQW layer 34 of the second column portions 30b. For the first electrode 50, for example, an electrode such as one in which a Cr layer, an Ni layer, and an Au layer are stacked in this order from the buffer layer 22 side is used.

The second electrode 52 is provided on the second semiconductor layer 36. The second electrode 52 is provided at the contact hole 42. The second electrode 52 is coupled to the second column portions 30b. The second electrode 52 is not coupled to the low column portions 132. The second semiconductor layer 36 of the second column portions 30b may be in ohmic contact with the second electrode 52. The second electrode 52 the other electrode for injecting current into the MQW layer 34 of the second column portions 30b. For the second electrode 52, for example, indium tin oxide (ITO), ZnO, or the like is used.

The first wiring 60 and the second wiring 62 are provided on the insulating layer 40. The wiring 60 and 62 is coupled to the second electrode 52. The wiring 60 and 62 is wiring for injecting current into the MWQ layer as light-emitting layer. The first wiring 60 couples the second electrode 52 and the pad 70. The second wiring 62 couples, for example, the second electrode 52 and the light-emitting element (not illustrated). The first wiring 60 overlaps first column portions 30a as viewed from the stacking direction. In the illustrated example, the first wiring 60 overlaps high column portions 130 and low column portions 132 as viewed from the stacking direction. The second wiring 62 overlaps high column portions 130 and low column portions 132 as viewed from the stacking direction. The material of the wiring 60 and 62 is, for example, Al, Cu, Au, Ti, or the like.

The pad 70 is provided on the insulating layer 40. The pad 70 overlaps the third region 6 as viewed from the stacking direction. The size in the Y-axis direction of the pad 70 is greater than the size in the Y-axis direction of the first wiring 60. For example, wire bondings (not illustrated) are coupled to the pad 70. The material of the pad 70 is, for example, the same as that of the first wiring 60.

Note that in the above description, the MQW layer 34 of an InGaN system has been described. However, for the MQW layer 34, various material systems capable of emitting light upon injection of current can be used in accordance with the wavelength of light to be emitted. For example, semiconductor materials such as an AlGaN system, an AlGaAs system, an InGaAs system, an InGaAsP system, an InP system, a GaP system, an AlGaP system, or the like can be used.

Furthermore, the light-emitting device 100 is not limited to lasers, and may be a light-emitting diode (LED).

The light-emitting device 100 has, for example, the following action and advantageous effects.

The light-emitting device 100 includes the substrate 10, the laminated structure 20 that is provided at the substrate 10 and that includes the plurality of column portions 30, and the insulating layer 40 covering the plurality of column portions 30. The plurality of column portions 30 include the plurality of first column portions 30a and the plurality of second column portions 30b. The plurality of first column portions 30a are column portions 30 that are provided at the outermost of the plurality of column portions 30 and That are a portion of the plurality of column portions 30. Each of the plurality of second column portions 30b includes the MQW layer 34 as light-emitting layer. Each of the plurality of first column portions 30a has a height smaller than that of the nearest second column portion 30b of the plurality of second column portions 30b.

Accordingly, in the light-emitting device 100, the level difference U formed by the plurality of column portions 30 can be reduced compared to a case in which, for example, the height of the first column portions is the same as the height of the nearest second column portion of the plurality of second column portions. Specifically, the level difference U between the portion of the laminated structure 20 where the column portions 30 are provided and the portion of the laminated structure 20 where no column portion 30 is provided can be reduced. This makes it possible to improve the adhesion of the insulating layer 60.

Figure 3:
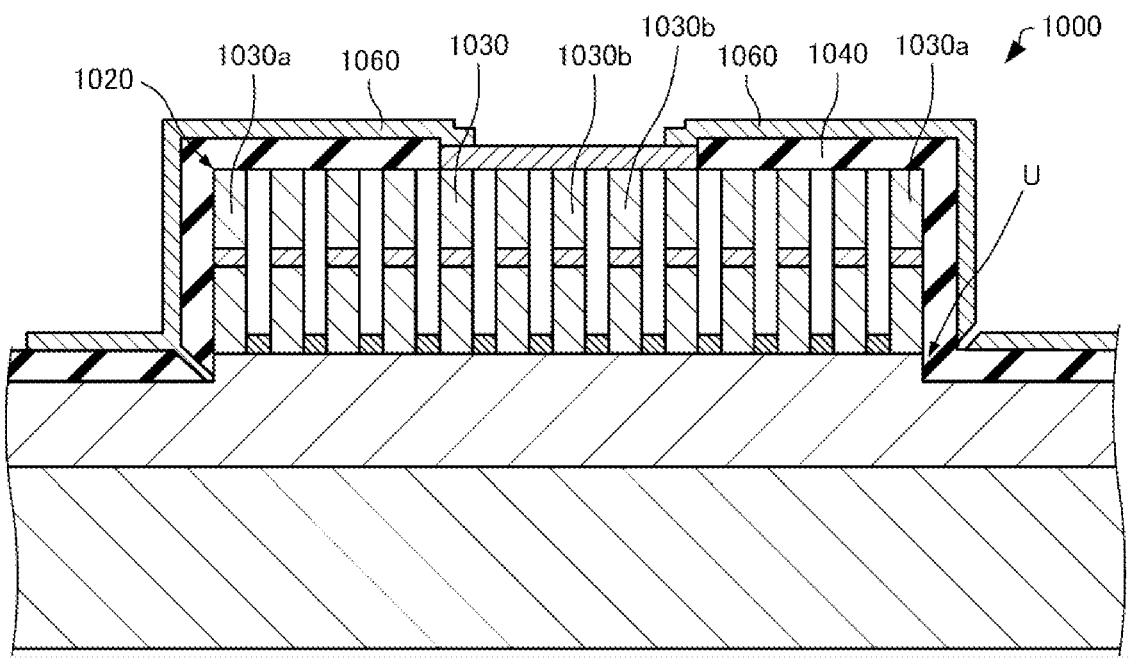
FIG. 3 is a cross-sectional view schematically illustrating a light-emitting device according to a reference example.

As illustrated in FIG. 3, when the height of first column portions 1030a is the same as the height of second column portions 1030b, the level difference U formed by the plurality of column portions 1030 is large, and an insulating layer 1040 does not adhere well at the portion where the level difference U is formed. Accordingly, a crack may occur in the insulating layer 1040 at the portion where the level difference U is formed, and wiring 1060 may enter the crack to cause contact between the wiring 1060 and the laminated structure 1020. This generates a leak current. Furthermore, the wiring 1060 does not adhere well at the portion where the level difference U is formed, and thus the wiring 1060 may be broken.

As described above, in the light-emitting device 100, the first column portions 30a have a height smaller than that of the nearest second column portion 30b of the plurality of second column portions 30b, and thus the problems described above can be avoided. Note that FIG. 3 is a cross-sectional view schematically illustrating a light-emitting device 1000 according to a reference example.

The light-emitting device 100 includes the first wiring 60 that is provided at the insulating layer 40 and that is for injecting current into the MWQ layer 34 as light-emitting layer. The first wiring 60 overlaps a plurality of first column portions 30a as viewed from the stacking direction. As described above, in the light-emitting device 100, the level difference U formed by the plurality of column portions 30 can be reduced, and thus it is possible to reduce the possibility of the first wiring 60 being broken.

1.2. Method of Manufacturing Light-Emitting Device

Figure 4:
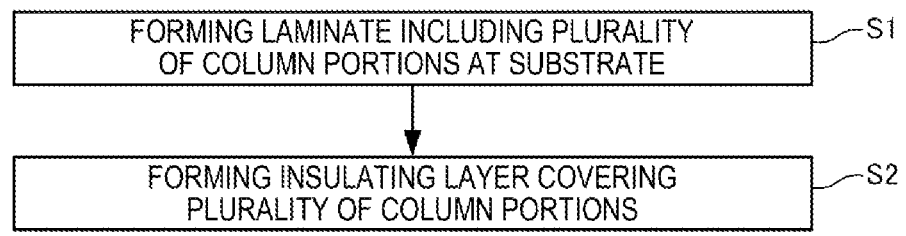
FIG. 4 is a flowchart for describing a method of manufacturing the light-emitting device according to the first embodiment.

Next, a method of manufacturing the light-emitting device 100 according to the first embodiment will be described with reference to drawings. FIG. 4 is a flowchart for describing a method of manufacturing the light-emitting device 100 according to the first embodiment.

As illustrated in FIG. 4, the method of manufacturing the light-emitting device 100 according to the first embodiment includes forming the laminated structure 20 including the plurality of column portions 30 at the substrate 10 (step S1) and forming the insulating layer 40 covering the plurality of column portions 30 (step S2). During forming the laminated structure 20 (step S1), the plurality of column portions 30 including the plurality of first column portions 30a and the plurality of second column portions 30b are formed. Each of the plurality of first column portions 30a is formed at the outermost of the plurality of column portions 30, and the plurality of second column portions 30b including the MQW layer 34 as light-emitting layer are formed. Each of the plurality of first column portions 30a has a height smaller than that of the nearest second column portion 30b of the plurality of second column portions 30b.

Hereinafter, the method of manufacturing the light-emitting device 100 according to the first embodiment will be described in more detail FIGS. 5 to 12 are cross-sectional views schematically illustrating manufacturing steps for the light-emitting device 100 according to the first embodiment.

Figure 5:
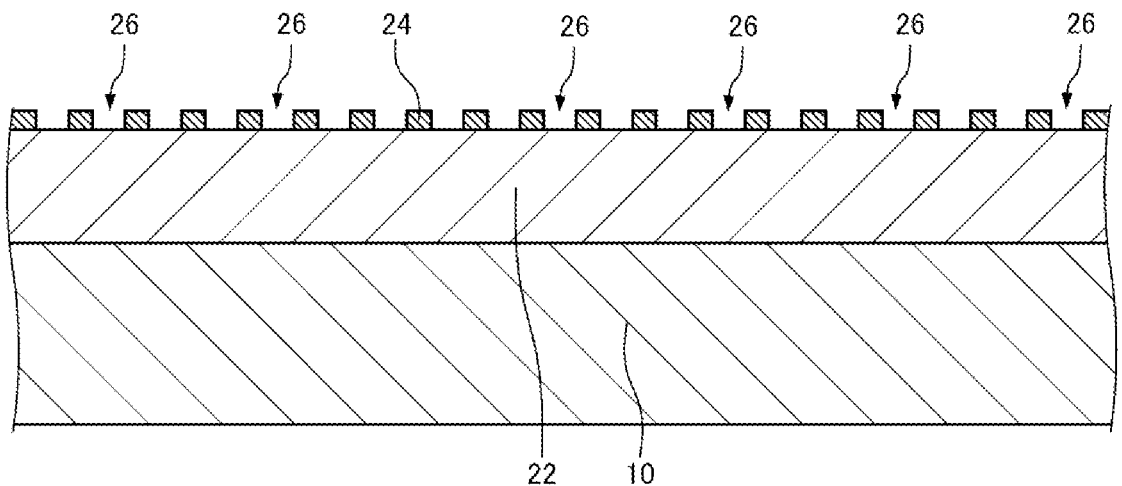
FIG. 5 is a cross-sectional view schematically illustrating a manufacturing step for the light-emitting device according to the first embodiment.

As illustrated in FIG. 5, the buffer layer 22 is epitaxially grown on the substrate 10. Examples of epitaxial growth methods include metal organic chemical vapor deposition (MOCVD) methods and molecular beam epitaxy (MBE) methods.

Next, a mask layer 24 is formed on the buffer layer 22. The mask layer 24 is formed by, for example, film formation by an electron beam vapor deposition method, a sputtering method, or the like, and patterning. Openings 26 for growing the column portions 30 are formed in the mask layer 24. Patterning is performed, for example, by electron beam lithography and dry etching.

Figure 6:
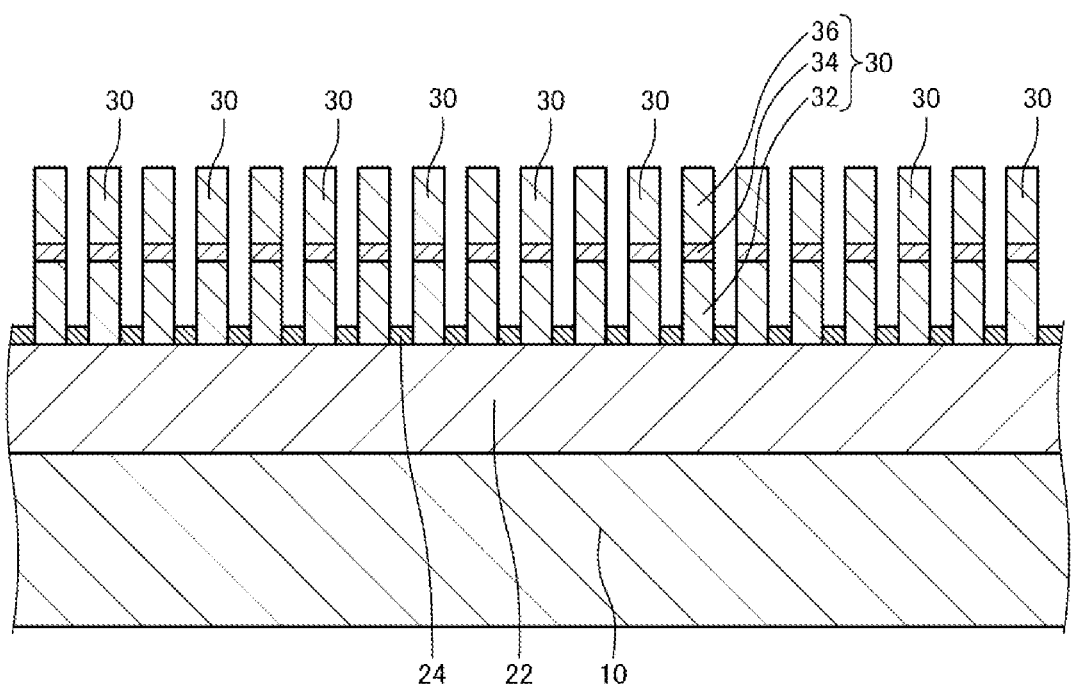
FIG. 6 is a cross-sectional view schematically illustrating a manufacturing step for the light-emitting device according to the first embodiment.

As illustrated in FIG. 6, with the mask layer 24 serving as a mask, the first semiconductor layer 32, the MQW layer 34, and the second semiconductor layer 36 are epitaxially grown in this order on the buffer layer 22. Examples of epitaxial growth methods include MOCVD methods and MBE methods. With this step, the plurality of column portions 30 can be formed.

Figure 7:
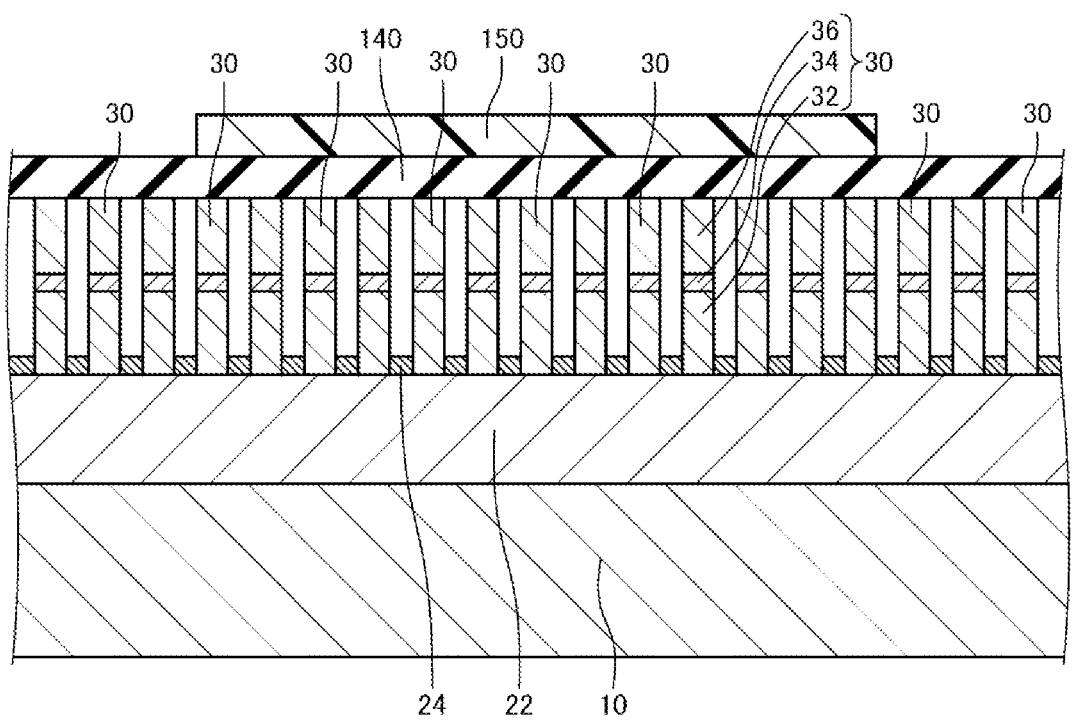
FIG. 7 is a cross-sectional view schematically illustrating a manufacturing step for the light-emitting device according to the first embodiment.

As illustrated in FIG. 7, a hard mask layer 140 is formed on the plurality of column portions 30. The hard mask layer 140 is, for example, a silicon oxide layer. Next, a resist layer 150 is formed on the hard mask layer 140.

Figure 8:
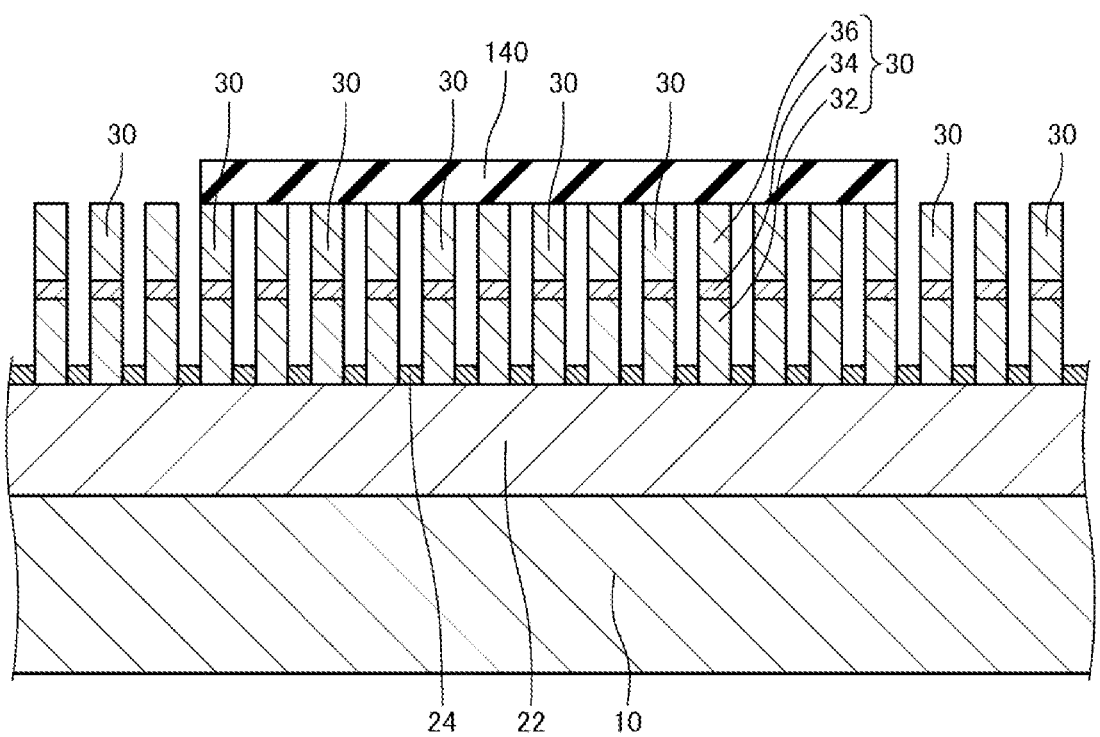
FIG. 8 is a cross-sectional view schematically illustrating a manufacturing step for the light-emitting device according to the first embodiment.

Next, as illustrated in FIG. 8, the hard mask layer 140 is etched with the resist layer 150 serving as a mask. This allows the hard mask layer 140 to be patterned into a predetermined shape. The shape of the patterned hard mask layer 140 is the same as the combined shape of the first region 2 and the second region 4 as viewed from the stacking direction. Thereafter, the resist layer 150 is removed.

Figure 9:
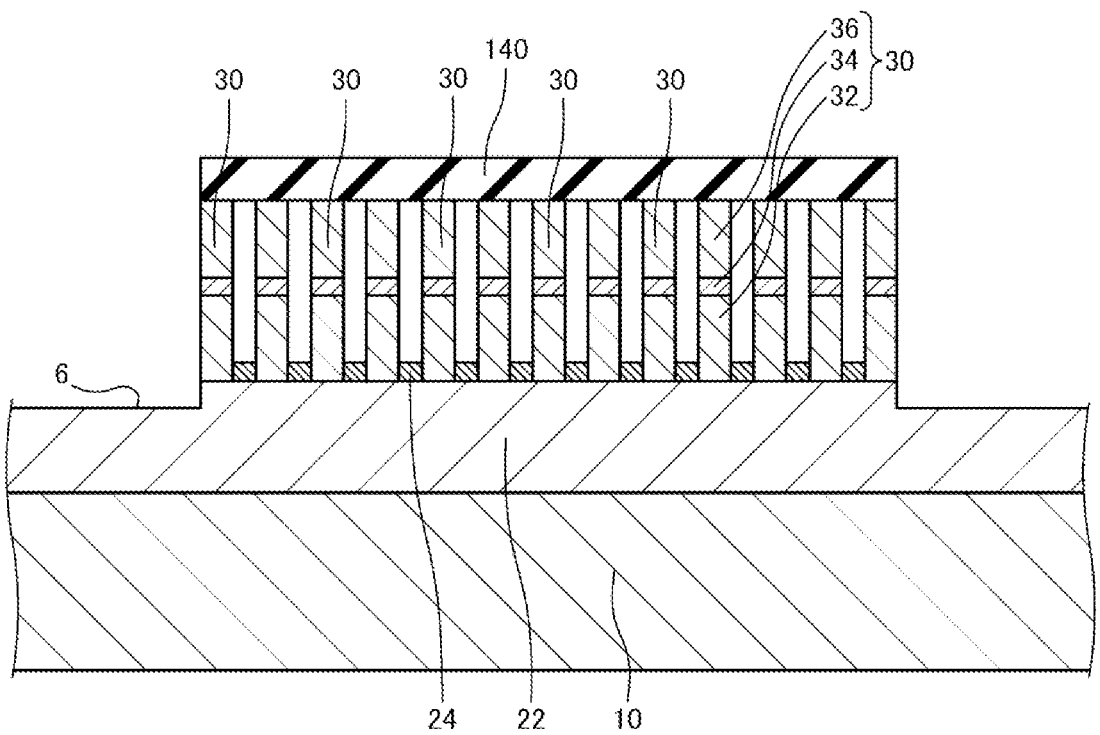
FIG. 9 is a cross-sectional view schematically illustrating a manufacturing step for the light-emitting device according to the first embodiment.

As illustrated in FIG. 9, the plurality of column portions 30 are dry-etched with the hard mask layer 140 serving as a mask. In this step, a portion of the buffer layer 22 is also etched. This step exposes the third region 6 of the buffer layer 22.

Figure 10:
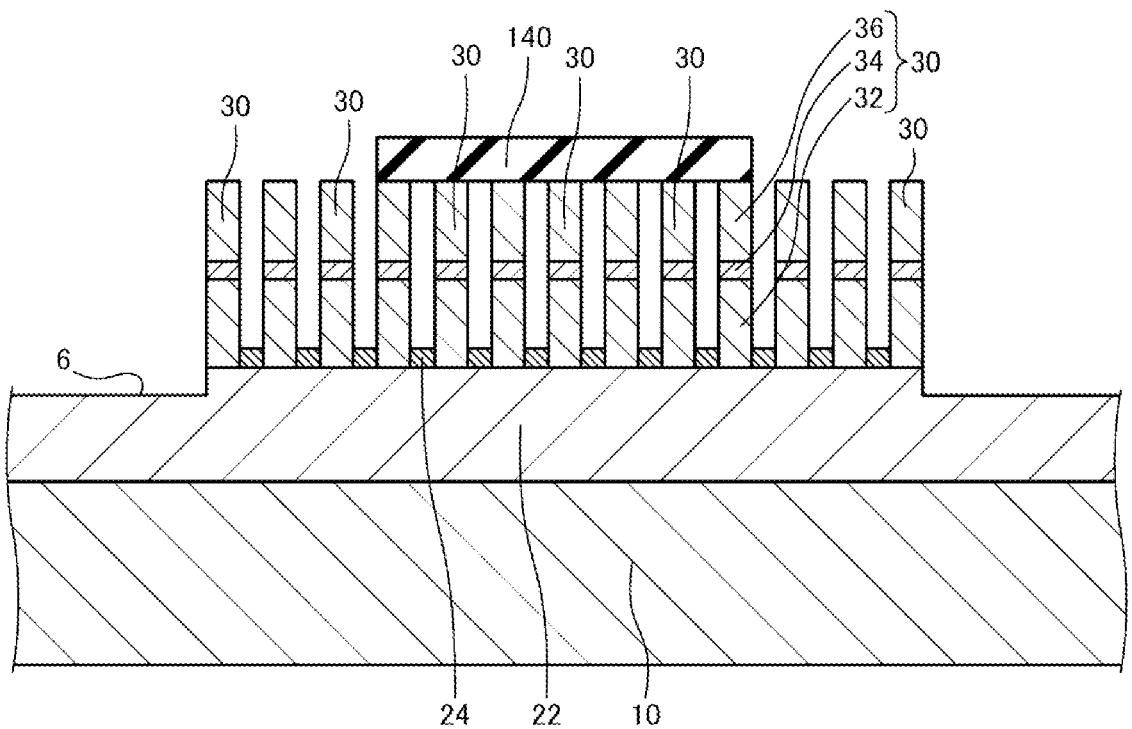
FIG. 10 is a cross-sectional view schematically illustrating a manufacturing step for the light-emitting device according to the first embodiment.

The hard mask layer 140 is patterned as illustrated in FIG. 10. Patterning is performed, for example, by photolithography and etching as described above. The shape of the patterned hard mask layer 140 is the same as the shape of the first region 2 as viewed from the stacking direction.

Figure 11:
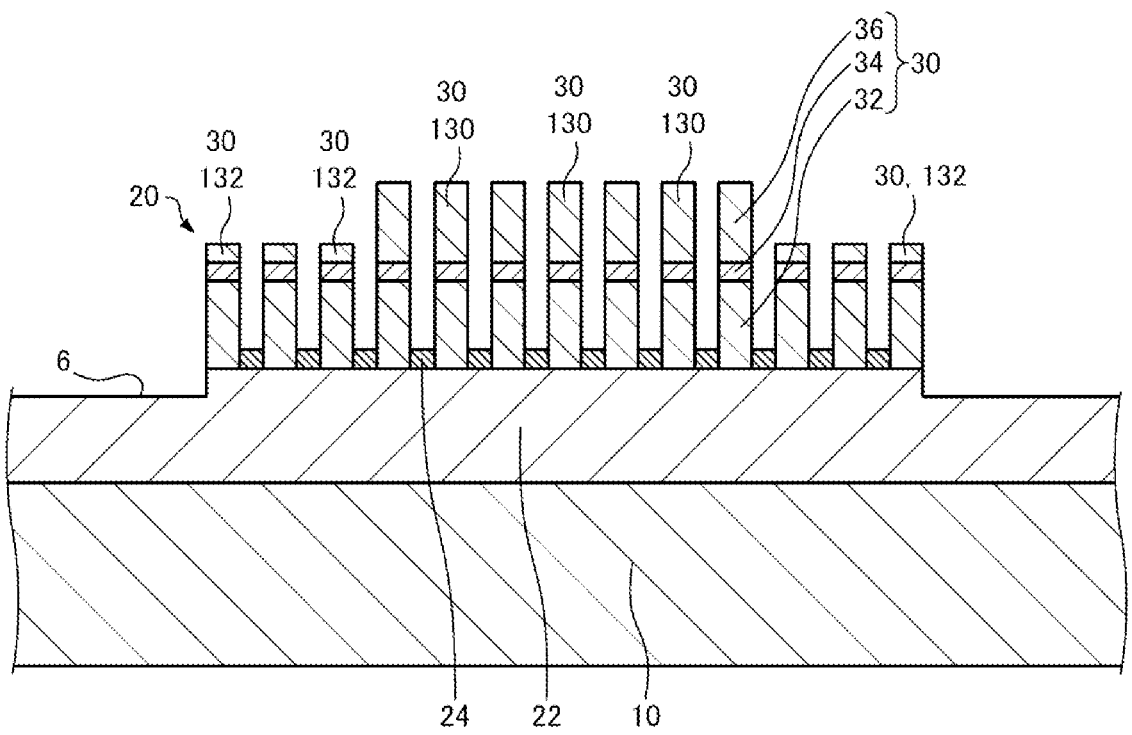
FIG. 11 is a cross-sectional view schematically illustrating a manufacturing step for the light-emitting device according to the first embodiment.

As illustrated in FIG. 11, the plurality of column portions 30 are dry-etched with the hard mask layer 140 serving as a mask. The column portions 30 etched in this step are the low column portions 132. The column portions 30 not etched in this step are the high column portions 130. Thereafter, the hard mask layer 140 is removed.

As illustrated in FIG. 2, the first electrode 50 is formed on the buffer layer 22. The first electrode 50 is formed by, for example, a vacuum vapor deposition method or a sputtering method.

Figure 12:
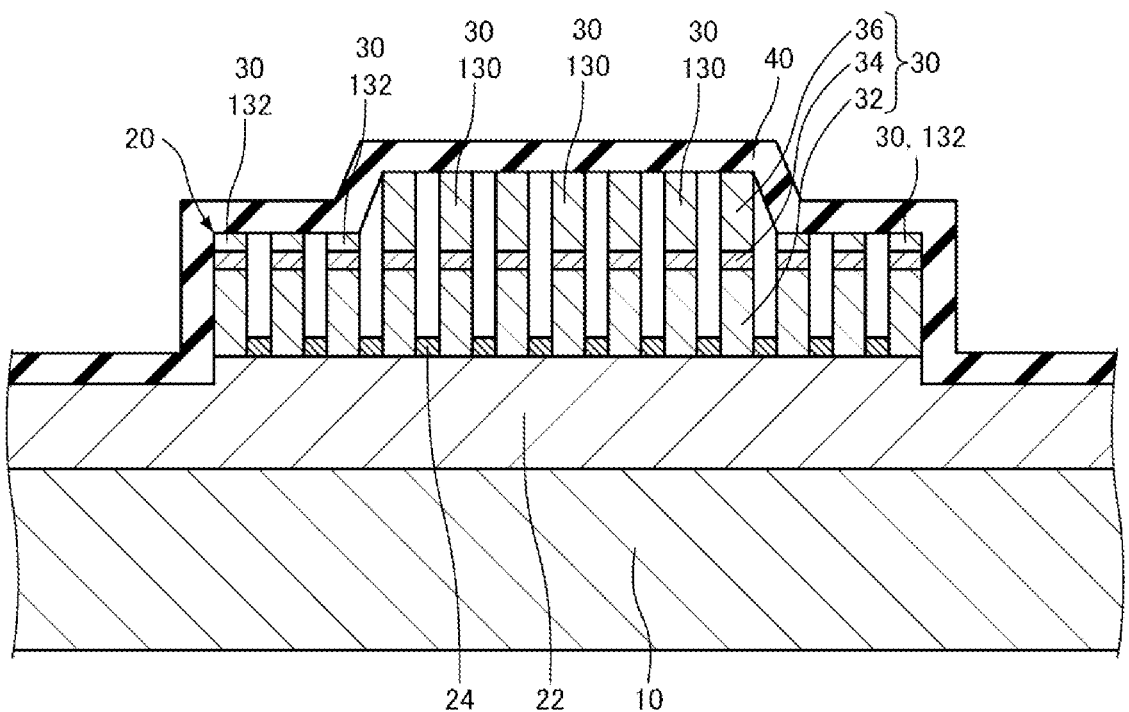
FIG. 12 is a cross-sectional view schematically illustrating a manufacturing step for the light-emitting device according to the first embodiment.

As illustrated in FIG. 12, the insulating layer 40 covering the plurality of column portions 30 is formed. The insulating layer 40 is formed by, for example, a chemical vapor deposition (CVD) method or a spin coating method.

As illustrated in FIG. 1, the insulating layer 40 is patterned to form the contact hole 42. Patterning is performed, for example, by photolithography and etching.

Next, the second electrode 52 is formed on a plurality of high column portions 130. The second electrode 52 is formed by, for example, a vacuum vapor deposition method or a sputtering method.

Next, the first wiring 60, the second wiring 62, and the pad 70 are formed on the insulating layer 40. The first wiring 60, the second wiring 62, and the pad 70 are formed by, for example, a sputtering method.

With the above steps, the light-emitting device 100 can be manufactured.

2. Second Embodiment 2.1. Light-Emitting Device

Figure 13:
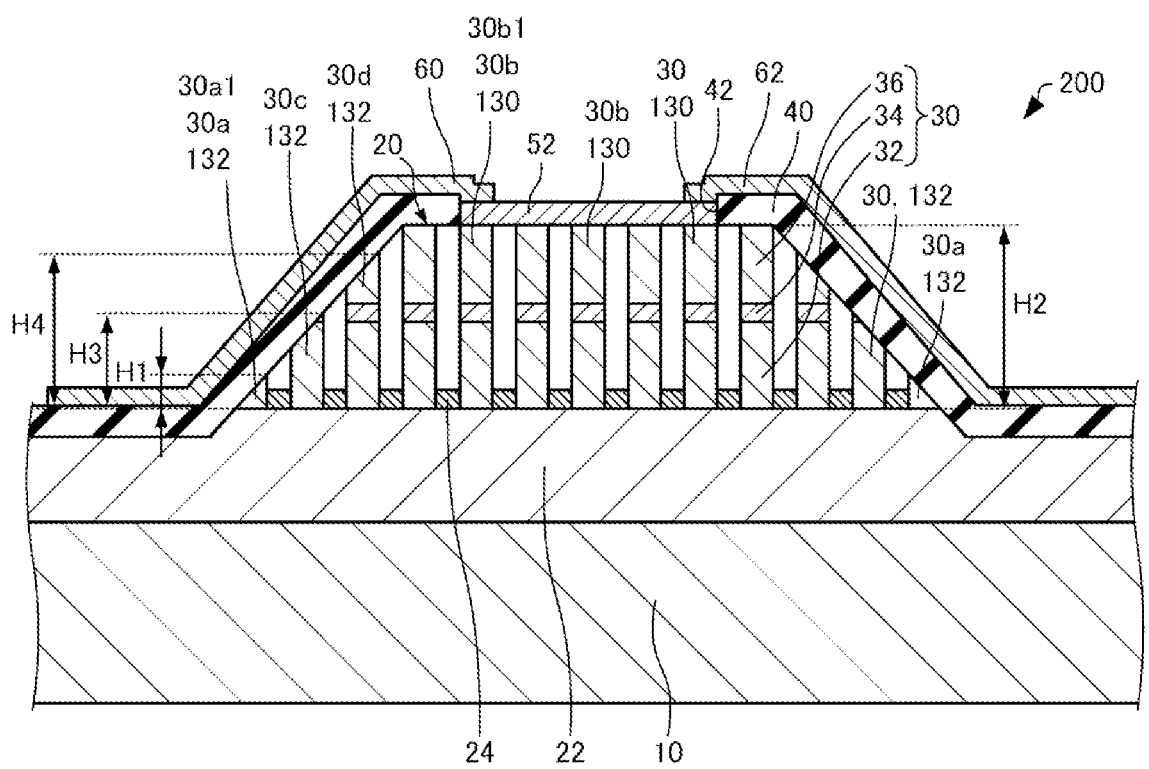
FIG. 13 is a cross-sectional view schematically illustrating a light-emitting device according to a second embodiment.

Next, a light-emitting device according to a second embodiment will be described with reference to drawings. FIG. 13 is a cross-sectional view schematically illustrating a light-emitting device 200 according to the second embodiment. Hereinafter, in the light-emitting device 200 according to the second embodiment, members having a function similar to that of the corresponding components of the light-emitting device 100 according to the first embodiment described above are denoted by the identical reference signs, with detailed description thereof being omitted.

In the light-emitting device 100 described above, as illustrated in FIG. 1, the height of the plurality of low column portions 132 is the same.

In contrast, in the light-emitting device 200, as illustrated in FIG. 13, the height of the plurality of low column portions 132 decreases from the second column portions 30b toward the outermost of the plurality of column portions 30.

The plurality of column portions 30 include a third column portion 30c and a fourth column portion 30d. The third column portion 30c of the plurality of column portions 30 is adjacent to the first column portion 30a1, which is one of the plurality of first column portions 30a. The fourth column portion 30d of the plurality of column portions 30 is adjacent to the third column portion 30c. The first column portion 30a1, the third column portion 30c, and the fourth column portion 30d are aligned in the direction away from the outermost part of the plurality of column portions 30 in the order of the first column portion 30a1, the third column portion 30c, and the fourth column portion 30d. In the illustrated example, the first column portion 30a1, the third column portion 30c, and the fourth column portion 30d are aligned in the direction from the outermost or the plurality of column portions 30 toward the second column portions 30b in the order of the first column portion 30a1, the third column portion 30c, and the fourth column portion 30d. The first column portion 30a1, the third column portion 30c, and the fourth column portion 30d are aligned in the X-axis direction.

The height H4 of the fourth column portion 30d is smaller than the height H2 of the second column portions 30b. The height H3 of the third column portion 30c is smaller than the height H4 of the fourth column portion 30d. The height H1 of the first column portion 30a1 is smaller than the height H3 of the third column portion 30c. The third column portion 30c and the fourth column portion 30d are low column portions 132. In the illustrated example, the upper surfaces of the low column portions 132 are inclined relative to the upper surface of the substrate 10. The upper surfaces of the low column portions 132 are inclined so that the outermost side of the plurality of column portions 30 is lower. The insulating layer 40 covers the first column portion 30a1, the third column portion 30c, and the fourth column portion 30d. The first wiring 60 overlaps the first column portion 30a1, the third column portion 30c, and the fourth column portion 30d as viewed from the stacking direction.

In the light-emitting device 200, the plurality of column portions 30 includes the third column portion 30c and the fourth column portion 30d. The third column portion 30c is adjacent to the first column portion 30a1, which is one of the plurality of first column portions 30a. The fourth column portion 30d is adjacent to the third column portion 30c. The first column portion 30a1, the third column portion 30c, and the fourth column portion 30d are aligned in the direction away from the outermost part of the plurality of column portions 30 in the order of the first column portion 30a1, the third column portion 30c, and the fourth column portion 30d. The height H4 of the fourth column portion 30d is smaller than the height H2 of each of the plurality of second column portions 30b. The height H3 of the third column portion 30c is smaller than the height H4 of the fourth column portion 30d. The height H1 of the first column portion 30a1 is smaller than the height H3 of the third column portion 30c.

Accordingly, in the light-emitting device 200, the height of the laminated structure 20 can be reduced stepwise toward the outermost of the plurality of column portions 30 compared to a case in which, for example, the height of the first column portions, the height of the second column portions, and the height of the fourth column portion are the same. This makes it possible to further improve the adhesion of the insulating layer 60.

2.2. Method of Manufacturing Light-Emitting Device

Figure 14:
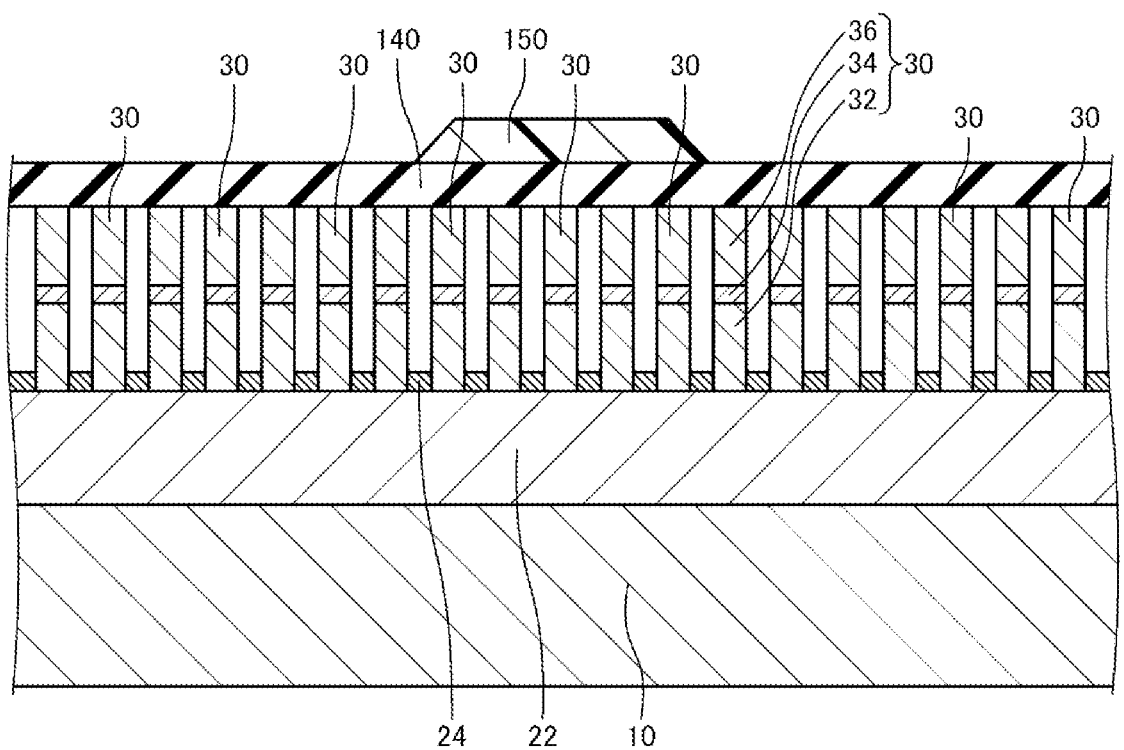
FIG. 14 is a cross-sectional view schematically illustrating a manufacturing step for the light-emitting device according to the second embodiment.
Figure 15:
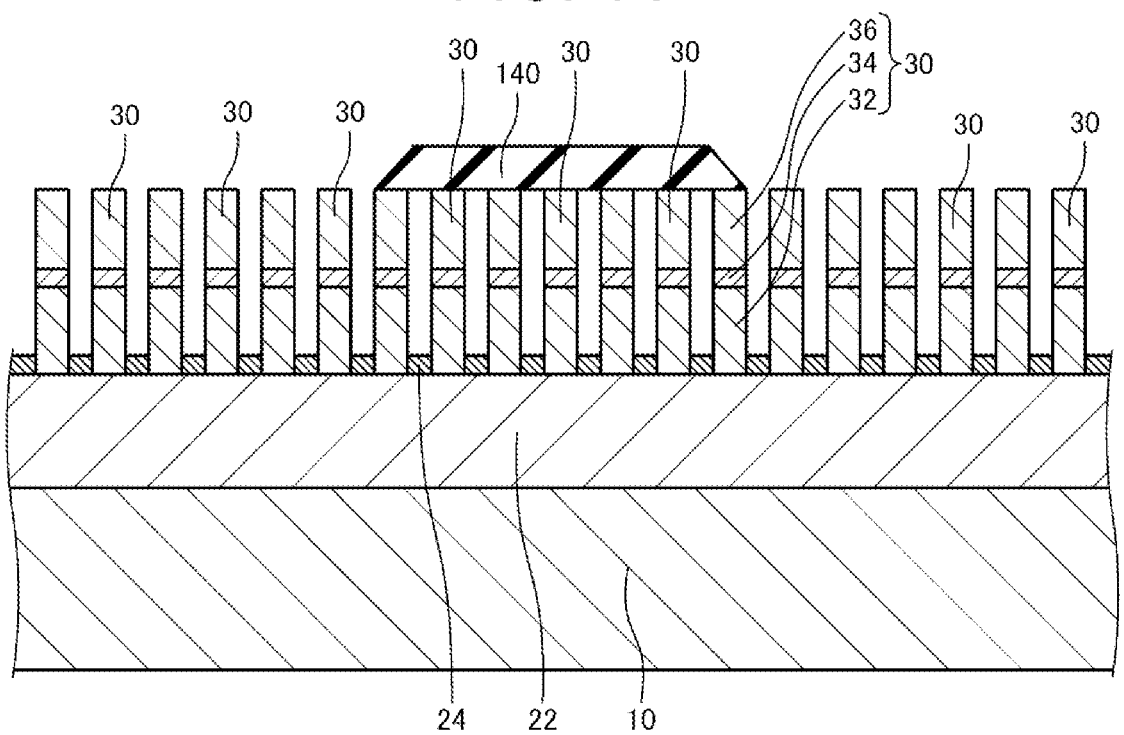
FIG. 15 is a cross-sectional view schematically illustrating a manufacturing step for the light-emitting device according to the second embodiment.
Figure 16:
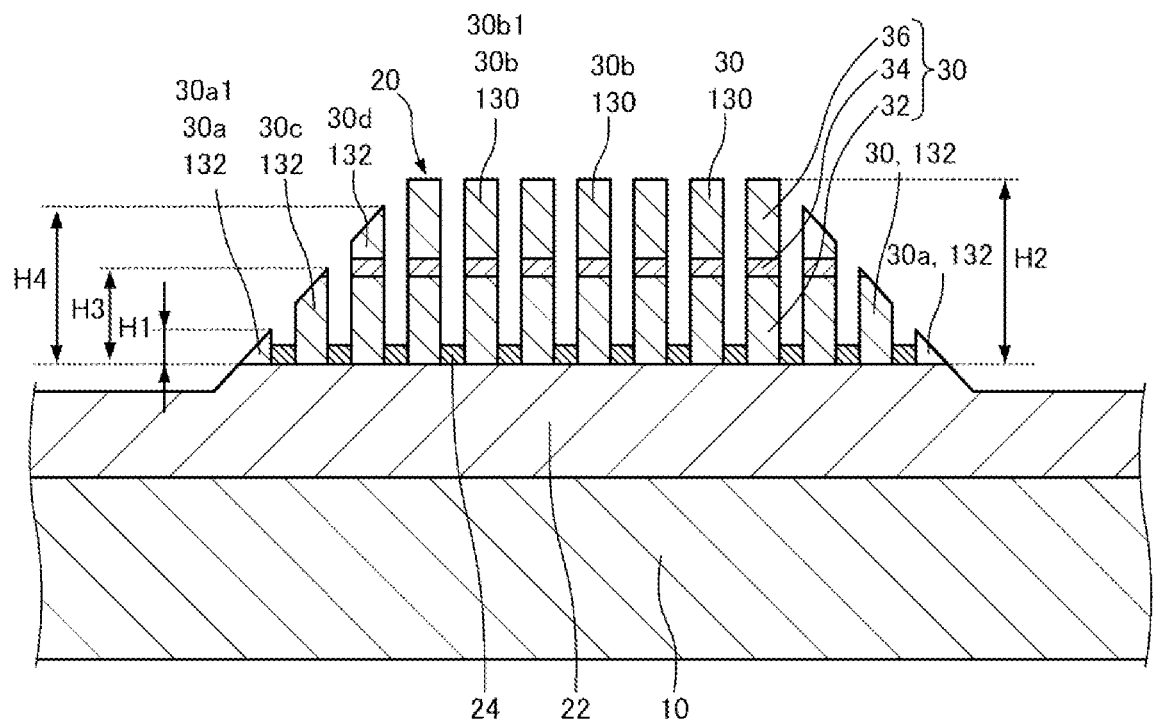
FIG. 16 is a cross-sectional view schematically illustrating a manufacturing step for the light-emitting device according to the second embodiment.

Next, a method of manufacturing the light-emitting device 200 according to the second embodiment will be described with reference to drawings. FIGS. 14 to 16 are cross-sectional views schematically illustrating manufacturing steps for the light-emitting device 200 according to the second embodiment.

Similar to the method of manufacturing the light-emitting device 100 described above, the buffer layer 22, the mask layer 24, and the plurality of column portions 30 are formed.

Next, as illustrated in FIG. 14, the hard mask layer 140 is formed on the plurality of column portions 30, and the resist layer 150 is formed on the hard mask layer 140. Next, the resist layer 150 is heated at 200° C., for example, to cause the upper surface of the resist layer 150 to be retracted. This causes the resist layer 150 to have a tapered shape of which the width of the upper surface is smaller than the width of the lower surface.

Next, the hard mask layer 140 is dry-etched with the tapered resist layer 150 serving as a mask. As illustrated in FIG. 15, the shape of the resist layer 150 is transferred to the hard mask layer 140, and thus the etched hard mask layer 140 has a tapered shape. Thereafter, the resist layer 150 is removed.

Next, the plurality of column portions 30 are dry-etched with the tapered hard mask layer 140 serving as a mask. As illustrated in FIG. 16, the shape of the hard mask layer 140 is transferred to the plurality of column portions 30, and the height of the plurality of low column portions 132 decreases from the second column portions 30b toward the outermost of the plurality of column portions 30. Accordingly, the height H4 of the fourth column portion 30d can be made smaller than the height H2 of the second column portions 30*b*, the height H3 of the third column portion. 30*c* can be made smaller than the height H4 of the fourth column portion 30*d*, and the height H1 of the first column portion 30*a*1 can be made smaller than the height H3 of the third column portion 30*c*. Thereafter, the hard mask layer 140 is removed.

Next, similar to the method of manufacturing the light-emitting device 100 described above, the first electrode 50, the insulating layer 40, the second electrode 52, the wiring 60 and 62, and the pad 70 are formed.

With the above steps, the light-emitting device 200 can be manufactured.

3. Third Embodiment

3.1. Light-Emitting Device

Figure 17:
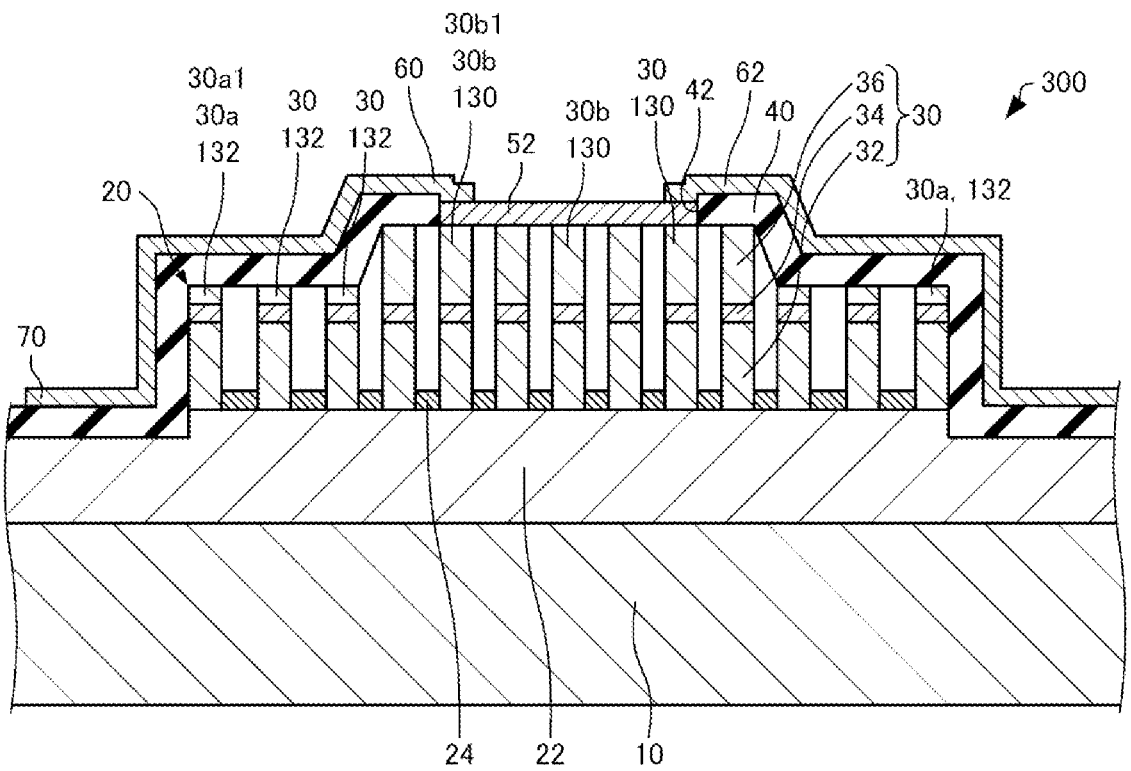
FIG. 17 is a cross-sectional view schematically illustrating a light-emitting device according to a third embodiment.

Next, a light-emitting device according to a third embodiment will be described with reference to drawings. FIG. 17 is a cross-sectional view schematically illustrating a light-emitting device 300 according to the third embodiment. Hereinafter, in the light-emitting device 300 according to the third embodiment, members having a function similar to that of the corresponding components of the light-emitting device 100 according to the first embodiment described above are denoted by the identical reference signs, with detailed description thereof being omitted.

In the light-emitting device 100 described above, as illustrated in FIG. 1, the distance between adjacent low column portions 132 is the same as the distance between adjacent high column portions 130.

In contrast, in the light-emitting device 300, as illustrated in FIG. 17, the distance between adjacent low column portions 132 is greater than the distance between adjacent high column portions 130.

3.2. Method of Manufacturing Light-Emitting Device

Figure 18:
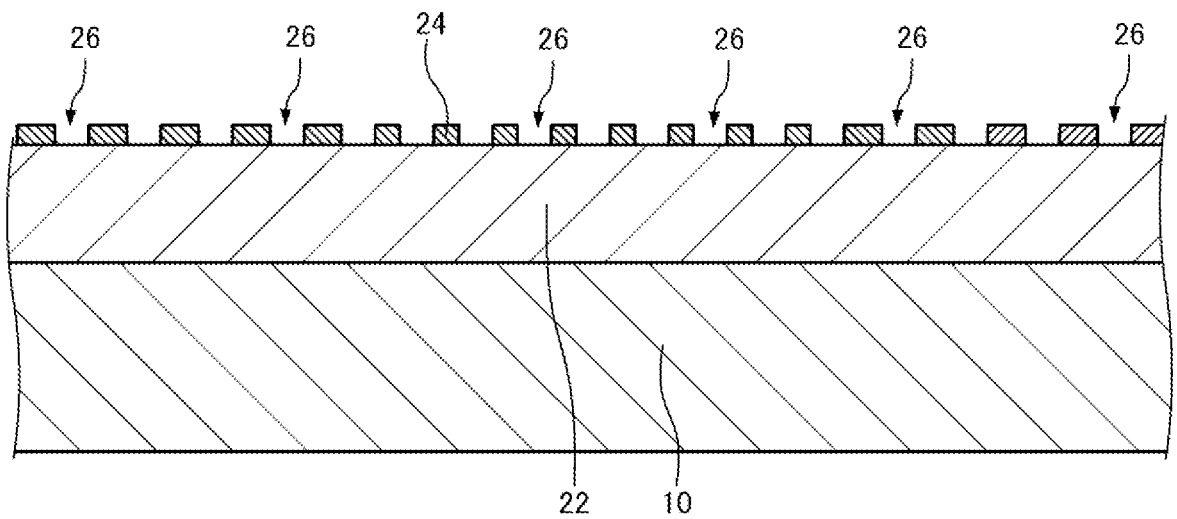
FIG. 18 is a cross-sectional view schematically illustrating a manufacturing step for the light-emitting device according to the third embodiment.

Next, a method of manufacturing the light-emitting device 300 according to the third embodiment will be described with reference to drawings. FIG. 18 is a cross-sectional view schematically illustrating a manufacturing step for the light-emitting device 200 according to the second embodiment.

Similar to the light-emitting device 100 described above, after the buffer layer 22 is grown, as illustrated in FIG. 18, the mask layer 24 is formed so that the distance between the openings 26 for growing adjacent low column portions 132 is greater than the distance between the openings 26 for growing adjacent high column portions 130.

Next, similar to the light-emitting device 100 described above, the plurality of column portions 30, the first electrode 50, the insulating layer 40, the second electrode 52, the wiring 60 and 62, and the pad 70 are formed.

With the above steps, the light-emitting device 300 can be manufactured.

4. Fourth Embodiment

4.1. Light-Emitting Device

Figure 19:
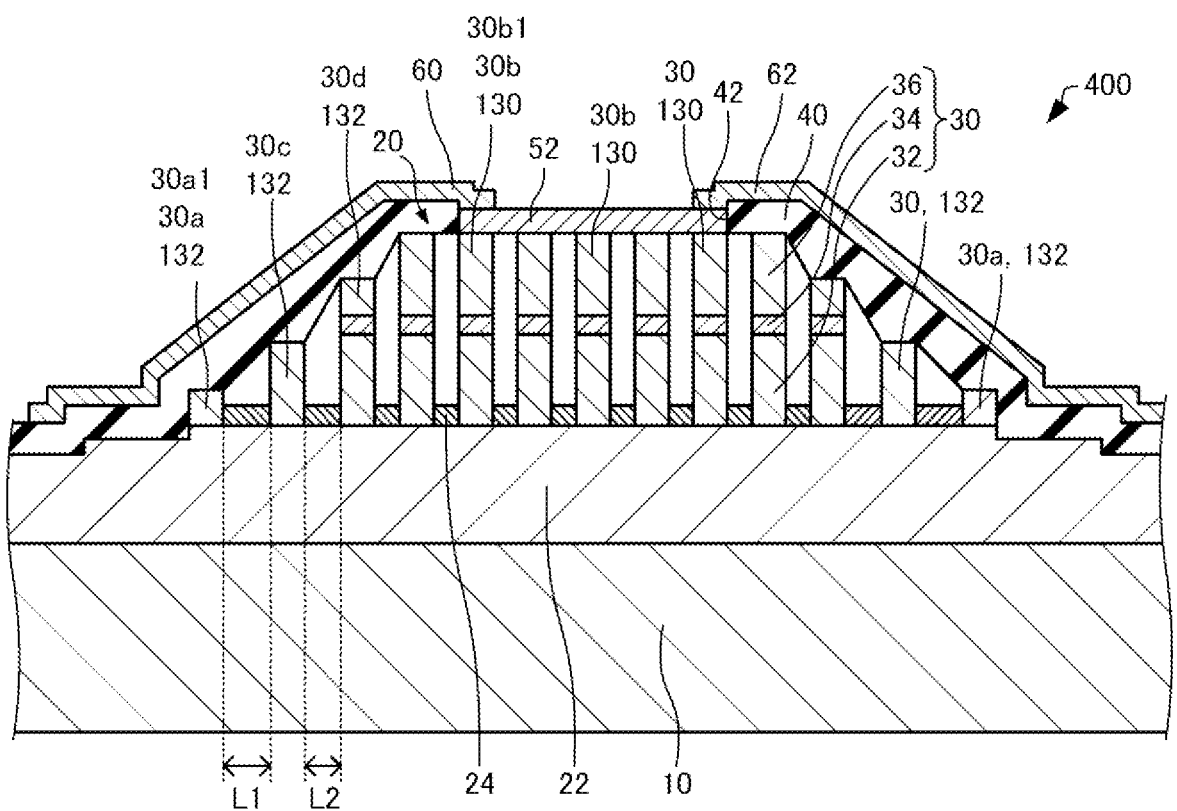
FIG. 19 is a cross-sectional view schematically illustrating a light-emitting device according to a fourth embodiment.

Next, a light-emitting device according to a fourth embodiment will be described with reference to drawings. FIG. 19 is a cross-sectional view schematically illustrating a light-emitting device 400 according to the fourth embodiment. Hereinafter, in the light-emitting device 400 according to the fourth embodiment, members having a function similar to that of the corresponding components of the light-emitting device 200 according to the second embodiment described above are denoted by the identical reference signs, with detailed description thereof being omitted.

In the light-emitting device 200 described above, as illustrated in FIG. 13, the distance between adjacent low column portions 132 is the same.

In contrast, in the light-emitting device 400, as illustrated in FIG. 19, the distance L1 between the first column portion 30*a*1 and the third column portion 30*c* is greater than the distance L2 between the third column portion 30*c* and the fourth column Portion 30*d*. The distance between adjacent low column portions 132 increases from the second column portions 30*b* toward the outermost of the plurality of column portions 30, for example in the illustrated example, the upper surfaces of the low column portions 132 are parallel to the upper surface of the substrate 10.

4.2. Method of Manufacturing Light-Emitting Device

Figure 20:
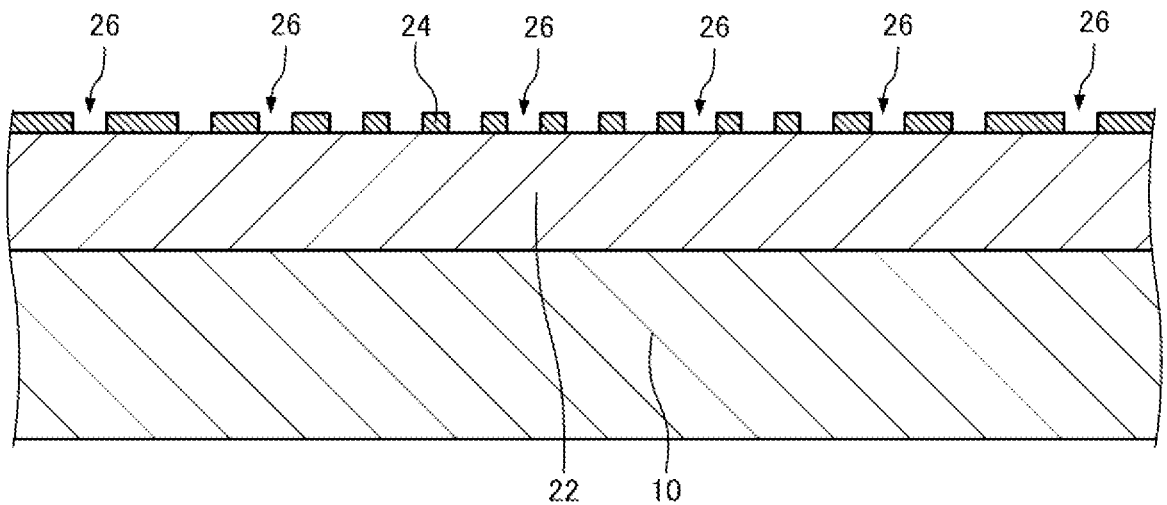
FIG. 20 is a cross-sectional view schematically illustrating a manufacturing step for the light-emitting device according to the fourth embodiment.
Figure 21:
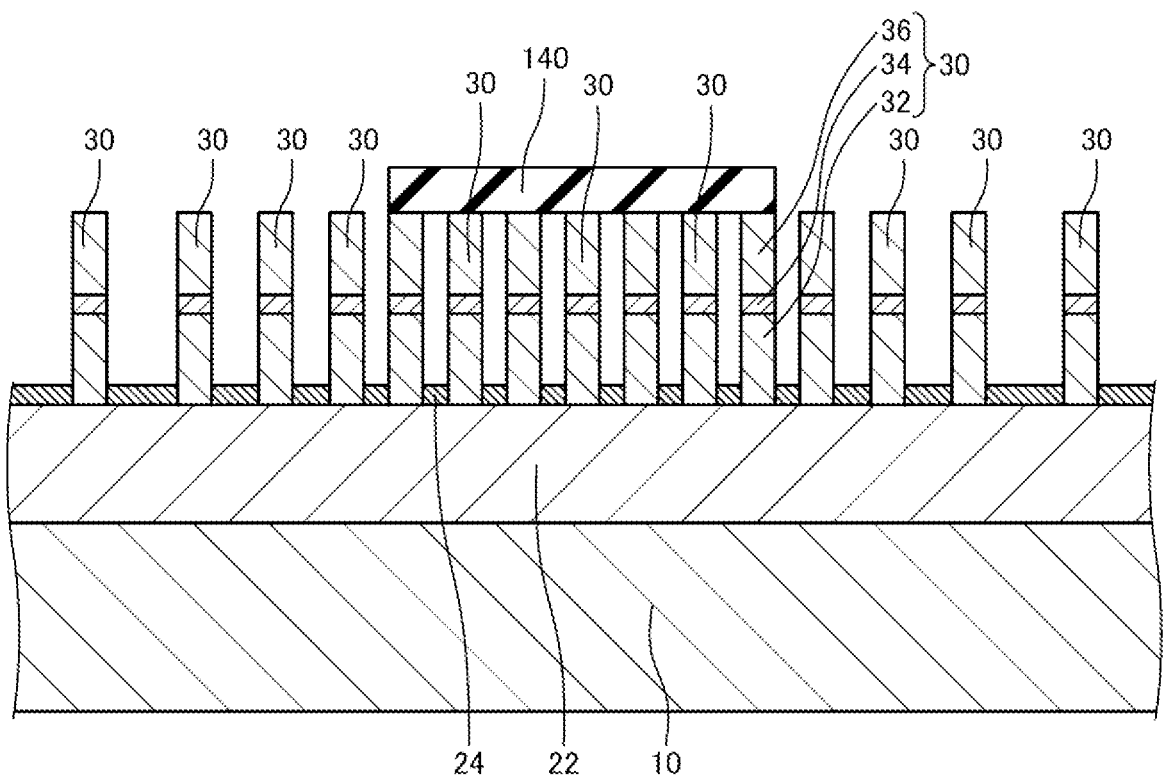
FIG. 21 is a cross-sectional view schematically illustrating a manufacturing step for the light-emitting device according to the fourth embodiment.
Figure 22:
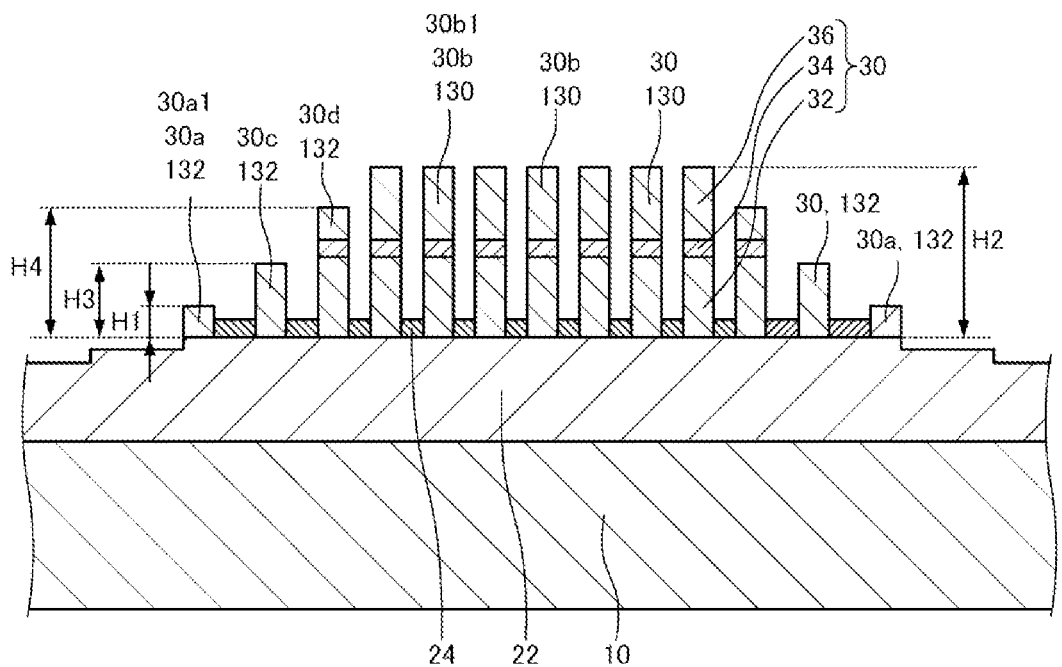
FIG. 22 is a cross-sectional view schematically illustrating a manufacturing step for the light-emitting device according to the fourth embodiment.

Next, a method of manufacturing the light-emitting device 400 according to the fourth embodiment will be described with reference to drawings. FIGS. 20 to 22 are cross-sectional views schematically illustrating manufacturing steps for the light-emitting device 400 according to the fourth embodiment.

Similar to the light-emitting device 100 described above, after the buffer layer 22 is grown, as illustrated in FIG. 20, the mask layer 24 is formed so that the distance between the openings 26 for growing adjacent low column portions 132 increases from the second column portions 30*b* toward the outermost of the plurality of column portions 30. Next, similar to the light-emitting device 100 described above, the plurality of column portions 30 are grown.

Next, as illustrated in FIG. 21, the hard mask layer 140 having the predetermined shape is formed on the plurality of column portions 30.

Next, as illustrated in FIG. 22, the plurality of column portions 30 are dry-etched with the hard mask layer 140 serving as a mask. Here, for the plurality of column portions 30, the greater the distance between adjacent column portions 30, the greater the etching rate. Accordingly, the height H4 of the fourth column portion 30*d* can be made smaller than the height H2 of the second column portion 30*b*. Further, the height H3 of the third column portion 30*c* can be made smaller than the height H4 of the fourth column portion 30*d*. Further, the height H1 of the first column portion 30*a*1 can be made smaller than the height H3 of the third column portion 30*c*.

Next, similar to the method of manufacturing the light-emitting device 100 described above, the first electrode 50, the insulating layer 40, the second electrode 52, the wiring 60 and 62, and the pad 70 are formed.

With the above steps, the light-emitting device 400 can be manufactured.

In the light-emitting device 400, the distance L1 between the first column portion 30*a*1, which is one of the plurality of first column portions 30*a*, and the third column portion 30*c* is greater than the distance L2 between the third column portion 30*c* and the fourth column portion 30*d*. As described above, the greater the distance between adjacent column portions 30, the faster the etching rate of dry etching. Therefore, in the light-emitting device 400, the difference in etching rate can be utilized to make the height H3 of the third column portion 30*c* smaller than the height H4 of the fourth column portion 30*d*, and make the height H1 of the first column portion 30*a*1 smaller than the height H3 of the third column Portion 30*c*.

5. Fifth Embodiment

5.1. Light-Emitting Device

Figure 23:
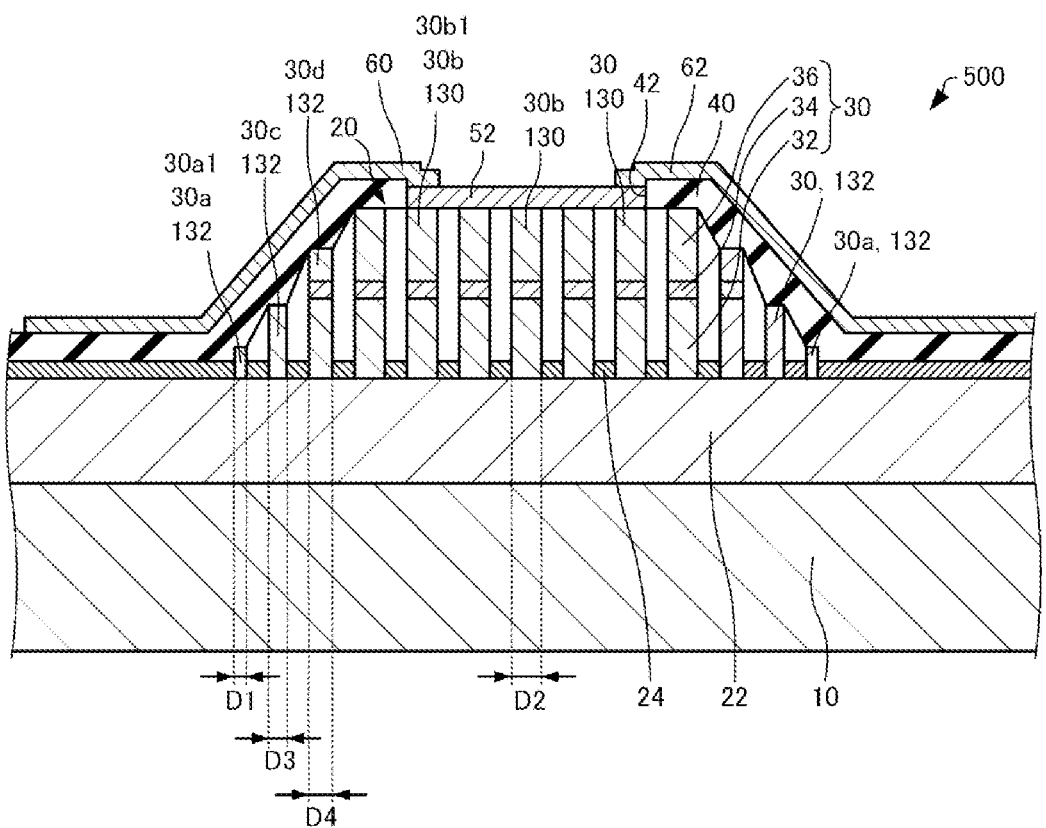
FIG. 23 is a cross-sectional view schematically illustrating a light-emitting device according to a fifth embodiment.

Next, a light-emitting device according to a fifth embodiment will be described with reference to drawings. FIG. 23 is a cross-sectional view schematically illustrating a light-emitting device 500 according to the fifth embodiment. Hereinafter, in the light-emitting device 500 according to the fifth embodiment, members having a function similar to that of the corresponding components of the light-emitting device 400 according to the fourth embodiment described above are denoted by the identical reference signs, with detailed description thereof being omitted.

In the light-emitting device 400 described above, as illustrated in FIG. 19, the diameter of the plurality of column portions 30 is the same.

In contrast, in the light-emitting device 500, as illustrated in FIG. 23, the diameter D1 of the first column portions 30a is smaller than the diameter D2 of the second column portions 30b. The diameter of the plurality of low column portions 132 decreases from the second column portions 30b toward the outermost of the plurality of column portions 30. The diameter of the plurality of high column portions 130 is, for example, the same. The diameter D4 of the fourth column portion 30d is smaller than the diameter D2 of the second column portions 30b. The diameter D3 of the third column portion 30c is smaller than the diameter D4 of the fourth column portion 30d. The diameter D1 of the first column portions 30a is smaller than the diameter D3 of the Third column portion 30c.

5.2. Method of Manufacturing Light-Emitting Device

Figure 24:
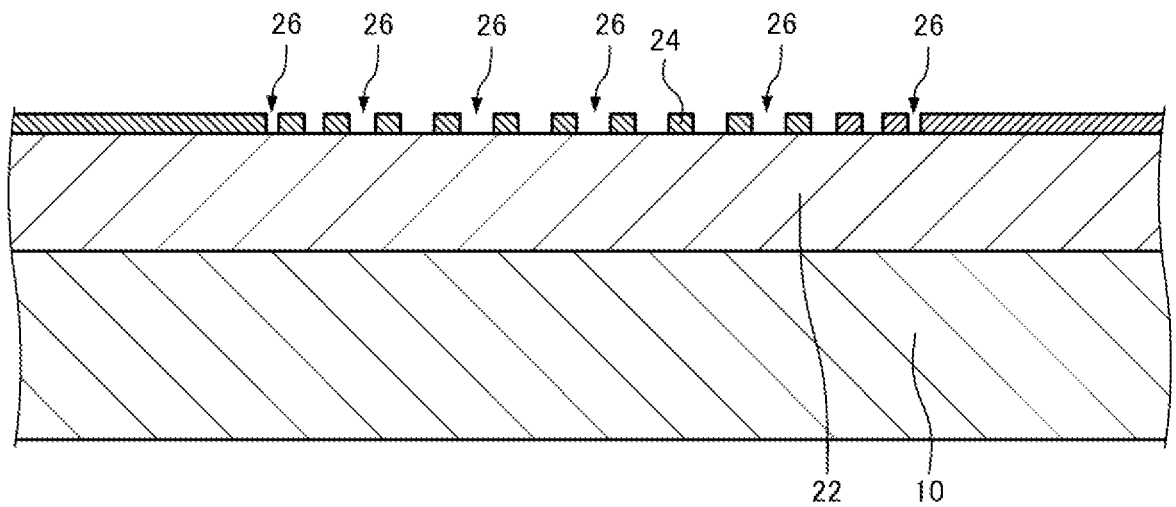
FIG. 24 is a cross-sectional view schematically illustrating a manufacturing step for the light-emitting device according to the fifth embodiment.

Next, the light-emitting device 500 according to the fifth embodiment will be described with reference to drawings. FIG. 24 is a cross-sectional view schematically illustrating a manufacturing step for the light-emitting device 500 according to the fifth embodiment.

Similar to the method of manufacturing the light-emitting device 100 described above, after the buffer layer 22 is grown, as illustrated in FIG. 24, the mask layer 24 is formed so that the diameter of the openings 26 for growing the plurality of low column portions 132 decreases from the second column portions 30b toward the outermost of the plurality of column portions 30. Next, similar to the method of manufacturing the light-emitting device 100 described above, the plurality of column portions 30 are grown.

Here, the smaller the diameter of the column portion 30, the slower the growth rate and the smaller the height. Accordingly, the height H4 of the fourth column portion 30d can be made smaller than the height H2 of the second column portion 30b. Further, the height H3 of the third column portion 30c can be made smaller than the height H4 of the fourth column portion 30d. Further, the height H1 of the first column portions 30a can be made smaller than the height H3 of the third column portion 30c.

Next, similar to the method of manufacturing the light-emitting device 100 described above, the first electrode 50, the insulating layer 40, the second electrode 52, the wiring 60 and 62, and the pad 70 are formed.

With the above steps, the light-emitting device 500 can be manufactured.

In the light-emitting device 500, the diameter D1 of each of the plurality of first column portions 30a is smaller than the diameter D2 of each of the plurality of second column portions 30b. As described above, the smaller the diameter of the column portion 30, the slower the growth rate and the smaller the height. Accordingly, in the light-emitting device 500, the difference in growth rate can be utilized to make the height H1 of the first column portions 30a smaller than the height H2 of the second column portions 30b.

6. Sixth Embodiment

Figure 25:
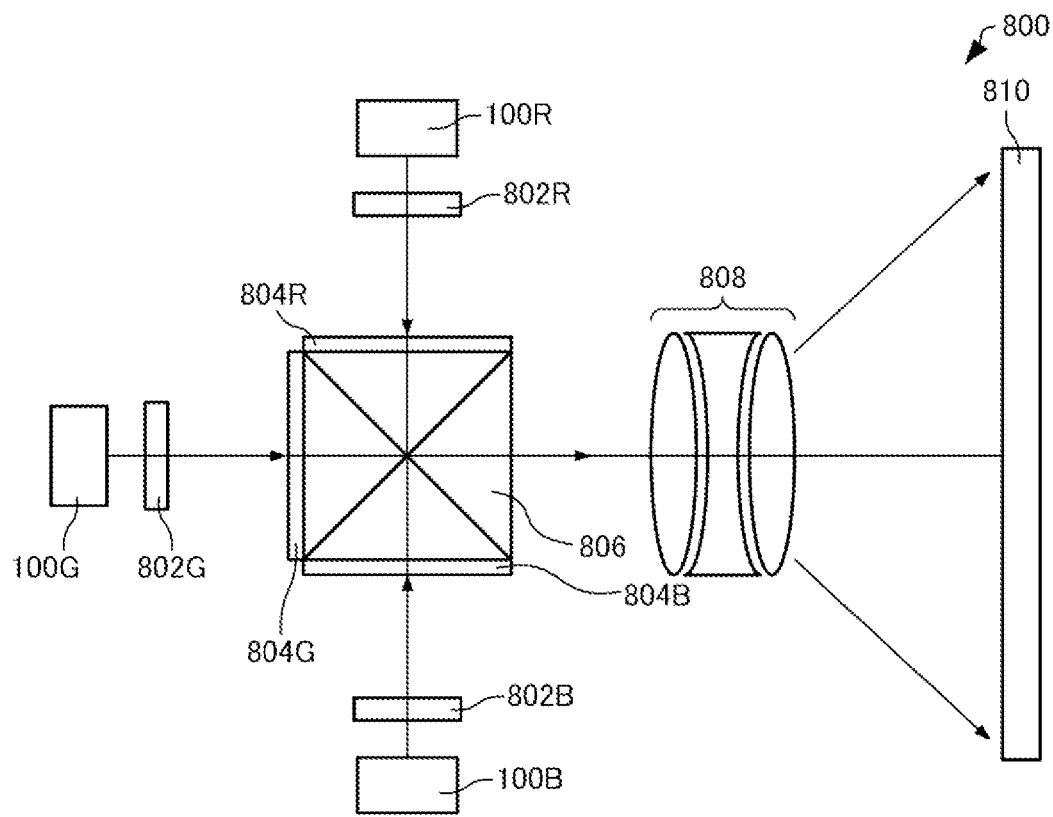
FIG. 25 is a view schematically illustrating a projector according to a sixth embodiment.

Next, a projector according to a sixth embodiment will be described with reference to drawings. FIG. 25 is a view schematically illustrating a projector 800 according to the sixth embodiment.

The projector 800 includes, for example, light-emitting devices 100 as light source.

The projector 800 includes a housing (not illustrated), and a red light source 100R, a green light source 100G, and a blue light source 100B that are included in the housing and that emit red light, Green light, and blue light, respectively. Note that in FIG. 25, the red light source 100S, the green light source 100G, and the blue light source 100B are simplified for convenience.

The projector 800 further includes a first optical element 802R, a second optical element 802G, a third optical element 802B, a first optical modulation device 804R, a second optical modulation device 804G, a third optical modulation device 804B, and a projection device 808, which are included in the housing. The first optical modulation device 804R, the second optical modulation device 804G, and the third optical modulation device 804B are each, for example, a transmission-type liquid crystal light valve. The projection device 808 is, for example, a projection lens.

Light emitted from the red light source 100R is incident on the first optical element 802R. Light emitted from the red light source 100R is focused by the first optical element 802R. Note that the first optical element 802R may have a function other than that of focusing. The same applies to the second optical element 802G and the third optical element 802B to be described later.

Light focused by first optical element 802R is incident on the first optical modulation device 804R. The first optical modulation device 804R modulates incident light in accordance with image information. Then, the projection device 808 enlarges and projects the image formed by the first optical modulation device 804R onto a screen 810.

The light emitted from the green light source 100G is incident on the second optical element 802G. The light emitted from the green light source 100G is focused by the second optical element 802G.

The light focused by the second optical element 802E is incident on the second optical modulation deice 804G. The second optical modulation device 804G modulates incident light in accordance with image information. Then, the projection device 808 enlarges and projects the image formed by the second optical modulation device 804G onto the screen 810.

Light emitted from the blue light source 100B is incident on the third optical element 802B. Light emitted from the blue light source 1003 is focused by the third optical element 802B.

Light focused by the third optical element 802B is incident on the third optical modulation device 804B. The third optical modulation device 804B modulates incident light in accordance with image information. Then, the projection device 808 enlarges and projects the image formed by the third optical modulation device 804B onto the screen 810.

The projector 800 can also include a cross dichroic prism 806 that synthesizes and guides light emitted from the first optical modulation device 804R, the second optical modulation device 804G, and the third optical modulation device 804B to the projection device 808.

Light of three colors modulated by the first optical modulation device 804R, the second optical modulation device 804G, and the third optical modulation device 804B, respectively, is incident on the cross dichroic prism 806. The cross dichroic prism 806 is formed by bonding together four right-angle prisms. A dielectric multilayer film that reflects red light and a dielectric multilayer film that reflects blue light are disposed on an inner surface of the cross dichroic prism 806, respectively. The light of three colors is synthesized by these dielectric multilayer films to form light representing a color image. Then, the synthesized light is projected onto the screen 810 by the projection device 808, causing an enlarged image to be displayed.

Note that by controlling light-emitting devices 100 as image pixels in accordance with image information, the red light source 100R, the green light source 100G, and the blue light source 1003 may directly form an image without using the first optical modulation device 804R, the second optical modulation device 804G, and the third optical modulation device 8043, Then, the projection device 808 may enlarge and project the image formed by the red light source 100R, the green light source 100G, and the blue light source 100B onto the screen 810.

Furthermore, in the example described above, transmission-type liquid crystal light valves are used as optical modulation devices; however, light valves other than liquid crystal light valves may be used, and reflective light valves may be used. Examples of such light valves include reflective liquid crystal light valves and digital micromirror devices. Furthermore, the configuration of the projection device is modified as appropriate depending on the type of light valves used.

The light source can also be applied to a light source device of a scanning type image display device, such as one including a scanning means that is an image forming device and that causes light from a light source to scan a screen and thereby causes an image of a desired size to be displayed on a display surface.

7. Seventh Embodiment

Figure 26:
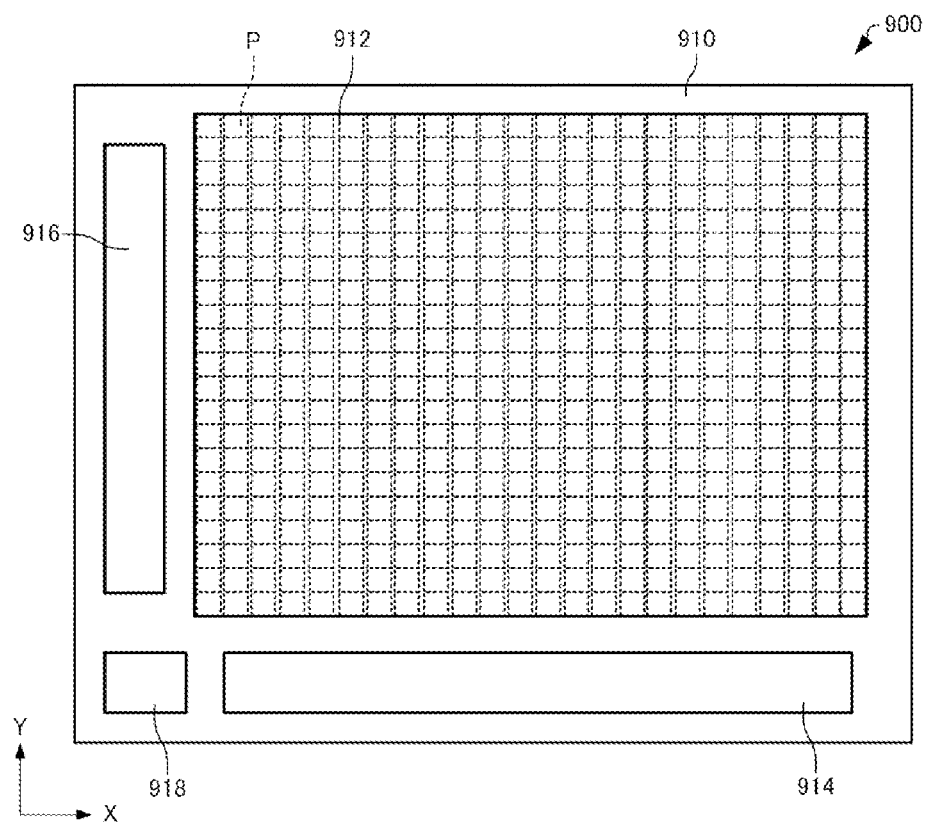
FIG. 26 is a plan view schematically illustrating a display according to a seventh embodiment.
Figure 27:
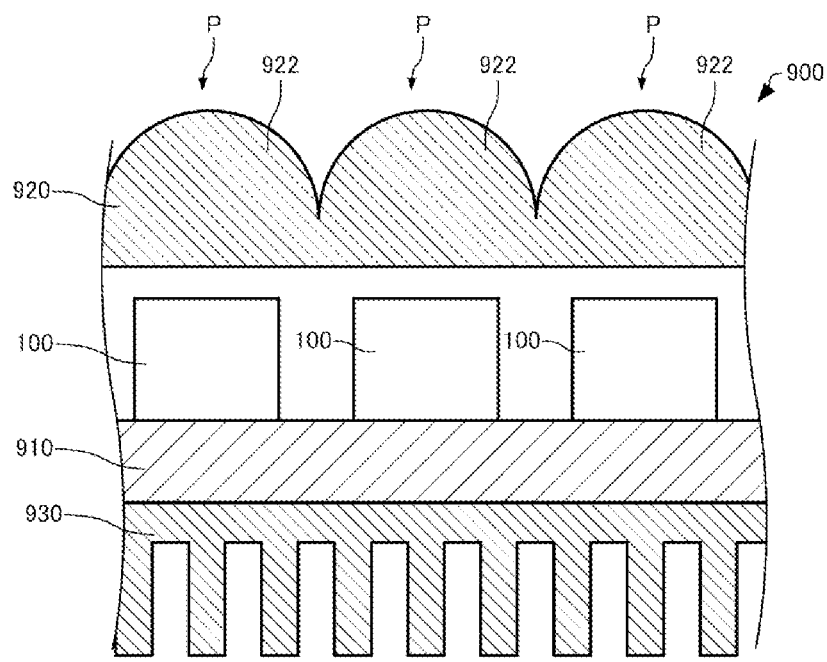
FIG. 27 is a cross-sectional view schematically illustrating the display according to the seventh embodiment.

Next, a display according to a seventh embodiment will be described with reference to drawings. FIG. 26 is a plan view schematically illustrating a display 900 according to the seventh embodiment. FIG. 27 is a cross-sectional view schematically illustrating the display 900 according; to the seventh embodiment. Note that in FIG. 26, the X-axis and the Y-axis are illustrated as two axes orthogonal to each other for convenience.

The display 900 includes, for example, light-emitting devices 100 as light source.

The display 900 is a display device that displays an image. The image includes those that only display character information. The display 900 is a self-luminous display. As illustrated in FIGS. 26 and 27, the display 900 includes a printed wired board 910, a lens array 920, and a heat sink 930.

The printed wired board 910 is equipped with a driving circuit for driving the light-emitting devices 100. The driving circuit is, for example, a circuit including a complementary metal oxide semiconductor (CMOS) or the like. The driving circuit drives the light-emitting devices 100 based on input image information, for example. Although not illustrated, a light-transmitting substrate for protecting the printed wired board. 910 is disposed on the printed wired board 910.

The printed wired board 910 includes a display region 912, a data line driving circuit 914, a scanning line driving circuit 916, and a control circuit 918.

The display region 912 is constituted by a plurality of pixels P. In the illustrated example, the pixels P are arranged along the X-axis and the Y-axis.

Although not illustrated, a plurality of scanning lines and a plurality of data lines are provided in the printed wired board 910. For example, the scanning lines extend along the X-axis, and the data lines extend along the Y-axis. The scanning lines are coupled to the scanning line driving circuit 916. The data lines are coupled to the data line driving circuit 914. The pixels P are provided corresponding to intersections between the scanning lines and the data lines.

One pixel P includes, for example, one light-emitting device 100, one lens 922, and a pixel circuit (not illustrated). The pixel circuit includes a switching transistor that functions as a switch of the pixel P. The gate of the switching transistor is coupled to the scanning line, and one of the source/drain is coupled to the data line.

The data line driving circuit 914 and the scanning line driving circuit 916 are circuits that control the driving of the light-emitting devices 100 that constitute the pixels P. The control circuit 918 controls the displaying of an image.

Image data is supplied from an upper circuit to the control circuit 918. The control circuit 918 supplies various signals based on such image data to the data line driving circuit 914 and scanning line driving circuit 916.

When the scanning line driving circuit 916 activates a scanning signal to select a scanning line, a switching transistor of the selected pixel P is turned on. At this time, the data line driving circuit 914 supplies a data signal from a data line to the selected pixel P, causing the light-emitting device 100 of the selected pixel P to emit light in accordance with the data signal.

The lens array 920 includes a plurality of lenses 922. For example, one lens 922 is provided for one light-emitting device 100. Light emitted from the light-emitting device 100 is incident on one lens 922.

The heat sink 930 is in contact with the printed wired board 910. The material of the heat sink 930 is, for example, a metal such as copper and aluminum. The heat sink 930 dissipates heat generated at the light-emitting devices 100.

The light-emitting device according to the embodiments described above can be used in applications other than projectors and displays. Applications other than projectors and displays include indoor and outdoor lighting, laser printers, scanners, on-vehicle lights, sensing apparatuses that use light, and light sources for communication apparatuses. The light-emitting device according to the embodiments described above can also be used as display devices for head-mounted displays.

The embodiments and modified examples described above are examples, and the present disclosure is not limited thereto. For example, any of the embodiments and the modified examples can be combined as appropriate.

The present disclosure encompasses configurations that are substantially identical to the configurations described in the embodiments: for example, configurations that have a function, method, and result identical to those of the configurations described in the embodiments, or configurations that have an object and advantageous effect identical to those of the configurations described in the embodiments. The present disclosure also encompasses configurations obtained by replacing a non-essential portion of the configurations described in the embodiments. The present disclosure also encompasses configurations that achieve an action and advantageous effect identical to those of the configurations described in the embodiments, or configurations that can achieve an object identical to that of the configurations described in the embodiments. The present disclosure also encompasses configurations obtained by adding a known technology to the configurations described in the embodiments.

The following contents are derived from the embodiments and modified examples described above.

One aspect of a light-emitting device includes a substrate, a laminated structure that is provided au the substrate and that includes a plurality of column portions, and an insulating layer covering the plurality of column portions, wherein the plurality of column portions include a plurality of first column portions and a plurality of second column portions, the plurality of first column portions are part of the plurality of column portions and provided on an outermost side of the plurality of column portions, each of the plurality of second column portions includes a light-emitting layer, and each of the plurality of first column portions has a height smaller than that of the nearest second column portion of the plurality of second column portions.

According to this light-emitting device, it is possible to improve the adhesion of the insulating layer.

One aspect of the lights-: mitting device includes wiring that is provided at the insulating layer and that is for injecting current into the light-emitting layer, wherein the wiring may overlap the plurality of first column portions as viewed from the normal direction of the substrate.

According to this light-emitting device, it is possible to reduce the possibility of the wiring being broken.

In one aspect of the light-emitting device, the plurality of column portions include a third column portion and a fourth column portion, the third column portion is adjacent to one of the plurality of first column portions, the fourth column portion is adjacent to the third column portion, the one of the plurality of first column portions, the third column portion, and the fourth column portion are aligned in the direction away from the outermost part of the plurality of column portions in the order of the one of the plurality of first column portions, the third column portion, and the fourth column portion, the height of the fourth column portion may be smaller than the height of each of the plurality of second column portions, the height of the third column portion may be smaller than the height of the fourth column portion, and the height of the one of the plurality of first column portions may be smaller than the height of the third column portion.

According to this light-emitting device, it is possible to further improve the adhesion of the insulating layer.

In one aspect of the light-emitting device, the distance between the one of the plurality of first column portions and the third column portion may be greater than the distance between the third column portion and the fourth column portion.

According to this light-emitting device, the height of the third column portion can be made smaller than the height of the fourth column portion, and the height of the first column portions can be made smaller than the height of the third column portion.

In one aspect of the light-emitting device, the diameter of each of the plurality of first column portions may be smaller than the diameter of each of the plurality of second column portions.

According to this light-emitting device, the height of the first column portions can be made smaller than the height of the second column portions.

One aspect of a method of manufacturing a light-emitting device according to the present disclosure includes forming a laminated structure including a plurality of column portions at a substrate, and forming an insulating layer covering the plurality of column portions, wherein during forming the laminated structure, the plurality of column portions including a plurality of first column portions and a plurality of second column portions are formed, the plurality of first column portions are part of the plurality of column portions and formed on an outermost side of the plurality of column portions, the plurality of second column portions including a light-emitting layer are formed, and each of the plurality of first column portions has a height smaller than that of the nearest second column portion of the plurality of second column portions.

One aspect of a projector includes one aspect of the light-emitting device.

One aspect of a display includes one aspect of the light-emitting device.

What is claimed is:

1. A light-emitting device comprising:
    a substrate;
    a laminated structure provided at the substrate and including a plurality of column portions; and
    an insulating layer covering the plurality of column portions, wherein
    the plurality of column portions include a plurality of first column portions and a plurality of second column portions,
    the plurality of first column portions are part of the plurality of column portions and provided on an outermost side of the plurality of column portions,
    each of the plurality of second column portions includes a light-emitting layer, and
    each of the plurality of first column portions has a height smaller than a height of a second column portion closest to the each of the plurality of first column portions, among the plurality of second column portions.

2. The light-emitting device according to claim 1, comprising
    wiring provided at the insulating layer for injecting current into the light-emitting layer, wherein
    the wiring overlaps the plurality of first column portions when viewed from a normal direction of the substrate.

3. The light-emitting device according to claim 1, wherein
    the plurality of column portions include a third column portion and a fourth column portion,
    the third column portion is adjacent to one of the plurality of first column portions,
    the fourth column portion is adjacent to the third column portion,
    the one of the plurality of first column portions, the third column portion, and the fourth column portion are aligned in a direction away from outermost part of the plurality of column portions, in an order of the one of the plurality of first column portions, the third column portion, and the fourth column portion,
    a height of the fourth column portion is smaller than a height of each of the plurality of second column portions,
    a height of the third column portion is smaller than the height of the fourth column portion, and
    a height of the one of the plurality of first column portions is smaller than the height of the third column portion.

4. The light-emitting device according to claim 3, wherein
    a distance between the one of the plurality of first column portions and the third column portion is greater than a distance between the third column portion and the fourth column portion.

5. The light-emitting device according to claim 1, wherein
    a diameter of each of the plurality of first column portions is smaller than a diameter of each of the plurality of second column portions.

6. A method of manufacturing a light-emitting device, the method comprising
- forming, at a substrate, a laminated structure, including a plurality of column portions; and
- forming an insulating layer configured to cover the plurality of column portions, wherein
- in the formation of the laminated structure,
- the plurality of column portions including a plurality of first column portions and a plurality of second column portions are formed,
- the plurality of first column portions are part of the plurality of column portions and formed on as outermost side of the plurality of column portions,
- the plurality of second column portions including a light-emitting layer are formed, and
- each of the plurality of first column portions has a height smaller than a height of a second column portion closest to the each of the plurality of first column portions among the plurality of second column portions.

7. A projector comprising the light-emitting device according to claim 1.

8. A display comprising the light-emitting device according to claim 1.

* * * * *